(12) United States Patent
Yamazaki et al.

(10) Patent No.: US 8,441,014 B2
(45) Date of Patent: May 14, 2013

(54) ELECTRO-OPTICAL DEVICE SUBSTRATE, ELECTRO-OPTICAL DEVICE, AND ELECTRONIC APPARATUS

(75) Inventors: Yasushi Yamazaki, Azumino (JP); Takashi Sato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 125 days.

(21) Appl. No.: 13/078,197

(22) Filed: Apr. 1, 2011

(65) Prior Publication Data

US 2011/0241003 A1    Oct. 6, 2011

(30) Foreign Application Priority Data

Apr. 5, 2010 (JP) ................. 2010-087243

(51) Int. Cl.
*H01L 29/04* (2006.01)
(52) U.S. Cl.
USPC ........................ 257/59; 257/E33.053
(58) Field of Classification Search .......... 257/59, 257/E33.053
See application file for complete search history.

(56) References Cited

U.S. PATENT DOCUMENTS

| 7,279,709 | B2 | 10/2007 | Lan et al. | |
|---|---|---|---|---|
| 7,518,666 | B2 | 4/2009 | Jung et al. | |
| 2002/0021483 | A1* | 2/2002 | Katase | 359/267 |
| 2004/0127038 | A1* | 7/2004 | Carcia et al. | 438/689 |
| 2006/0148141 | A1* | 7/2006 | Seo et al. | 438/151 |

FOREIGN PATENT DOCUMENTS

| JP | A-2005-346090 | 12/2005 |
|---|---|---|
| JP | B2-4275671 | 3/2009 |

* cited by examiner

*Primary Examiner* — Kimberly Rizkallah
*Assistant Examiner* — Timor Karimy
(74) *Attorney, Agent, or Firm* — Oliff & Berridge, PLC

(57) ABSTRACT

In an electro-optical device substrate, first and second pixel switching elements each include a gate electrode formed of a first conductive film, a gate insulation film formed of a first insulation film, a semiconductor layer, a source electrode formed of a second conductive film, and a drain electrode formed of the second conductive film. A first storage capacitor includes a first storage capacitor electrode formed of the second conductive film, a protective film formed of a second insulation film so as to over at least the first storage capacitor electrode, and a pixel electrode formed so as to overlap with the first storage capacitor electrode at least partially with the protective film interposed therebetween.

20 Claims, 14 Drawing Sheets

ELECTRO-OPTICAL DEVICE SUBSTRATE, ELECTRO-OPTICAL DEVICE, AND ELECTRONIC APPARATUS

CROSS-REFERENCE TO RELATED APPLICATION

This application is based on and claims priority from Japanese Patent Application No. 2010-087243, filed on Apr. 5, 2010, the contents of which are incorporated herein by reference.

BACKGROUND

1. Technical Field

The present invention relates to an electro-optical device substrate, an electro-optical device, and an electronic apparatus.

2. Related Art

As an electro-optical device, there is known an electrophoretic display device in which an electrophoretic element having a liquid dispersion medium and electrophoretic particles is interposed between a pair of substrates. Since such a kind of electrophoretic display device has a memory property, application of a voltage is not normally necessary to maintain a display state and a voltage may be applied only during a period in which the display state is changed. However, the voltage has to be held for respective pixels forming display during a given period, and thus it is necessary for each of the pixels to include a storage capacitor. Therefore, electrophoretic display devices having the storage capacitor are disclosed in, for example, Japanese Patent No. 4275671 and JP-A-2005-346090. According to Japanese Patent No. 4275671 and JP-A-2005-346090, in the electrophoretic display device, a pixel voltage can be sufficiently held by adding an electrophoretic element capacitor formed between a pixel electrode and a common electrode and a storage capacitor electrically in parallel.

In the electrophoretic display device disclosed in Japanese Patent No. 4275671 and JP-A-2005-346090, the storage capacitor includes a capacitor lower electrode formed in the same layer as that of a scanning line, a gate insulation film, and a capacitor upper electrode formed in the same layer as that of a data line with the gate insulation film interposed therebetween. When such a configuration is used, the scanning line and the capacitor lower electrode are disposed in the same layer. Therefore, it is necessary to prevent short circuit between the scanning line and the capacitor lower electrode. However, it is difficult to increase the size of the pixel when it is intended to form the pixel with high precision. Therefore, when a large space is disposed to prevent the short circuit, the storage capacitor having a sufficient capacitance value may not be formed. On the contrary, when a sufficient space is disposed to form the scanning line and the capacitor lower electrode in order to obtain a sufficient capacitance value, it is difficult to realize the high precision pixel.

As other methods, there have been suggested a method of using a material with a high specific inductive capacity in a capacitor insulation film and a method of increasing the storage capacitance value by making the capacitor insulation film thin. In these methods, however, since the capacitor insulation film is formed of a gate insulation film, for example, leakage current of a thin film transistor (hereinafter, abbreviated as a TFT) may increase. Therefore, there may be an adverse influence on the characteristics of the TFT.

When a sufficient storage capacitance value is not obtained, a feed-through voltage is increased when the TFT is turned off. Moreover, a variation in the feed-through voltage caused due to the variation in the capacitance of the TFT may not be allowed. As a consequence, display unevenness may be considerably shown particularly in the display of a half tone. The display unevenness is a particular problem of the electrophoretic display device which is a direct current display device and is a problem which occurs since the feed-through voltage is more irregular than that of a liquid crystal display device of an effective value response.

Moreover, when the sufficient storage capacitance value is not obtained, it is necessary to write the storage capacitance across a plurality of frames in order to refresh the pixel voltage. However, since the energy consumption (power× time) of the electrophoretic display device is mainly an energy consumed to charge a parasitic capacitance of the data lines, a problem may arise in that the energy corresponding to the energy used to charge the data lines may be unnecessarily consumed and the power consumption thus increases when the plurality of frames is driven.

For example, in the electrophoretic display device disclosed in JP-A-2005-346090, a gate insulation film which is a capacitor insulation film is etched to form a thin film. In this case, however, since not only a film forming variation of the gate insulation film occurs but also an etching variation occurs, regularity of the storage capacitors may deteriorate and a problem with display unevenness may thus occur due to a variation in the above-described feed-through voltage.

Here, the electrophoretic display device has been described as a prominent example, but such problems occur not only in the electrophoretic display device but also in other electro-optical devices which drive an electro-optical material using a pixel switching element such as a TFT and a storage capacitor.

SUMMARY

An advantage of, some aspects of the invention is that it provides an electro-optical device substrate, which includes a storage capacitor having a sufficient capacitance value and is capable of reliably suppressing occurrence of display unevenness and which consumes less energy, an electro-optical device, and an electronic apparatus including a display unit with no display unevenness.

According to an aspect of the invention, there is provided an electro-optical device substrate including: a substrate body; a plurality of data lines and a plurality of scanning lines formed in the substrate body; and a plurality of pixels partitioned by the data lines and the scanning lines. Each of the plurality of pixels includes a pixel switching element, a pixel electrode, and a first storage capacitor. The pixel switching element includes a gate electrode formed of a first conductive film formed on the substrate body, a gate insulation film formed of a first insulation film formed so as to cover at least the gate electrode, a semiconductor layer formed on the gate insulation film, a source electrode formed of a second conductive film electrically connected to a source region of the semiconductor layer and the data line, and a drain electrode formed of the second conductive film electrically connected to a drain region of the semiconductor layer and the pixel electrode. The first storage capacitor includes a first storage capacitor electrode formed of the second conductive film, a first storage insulation film formed of a second insulation film so as to cover at least the first storage capacitor electrode, and the pixel electrode formed so as to overlap with the first storage capacitor electrode at least partially with the first storage insulation film interposed therebetween when viewed from a normal direction of the substrate body.

In the electro-optical device substrate according to the aspect of the invention, the first storage capacitor includes the first storage capacitor electrode formed of the second conductive film formed in the same layer as that of the source electrode and the drain electrode of the pixel switching element, the first storage capacitor insulation film formed of the second insulation film, and a part of the pixel electrode formed so as to overlap with the first storage capacitor electrode at least partially. That is, the first storage capacitor according to the aspect of the invention does not include the capacitor electrode or the gate insulation film formed in the same layer as that of the scanning line, as disclosed in Japanese Patent No. 4275671 and JP-A-2005-346090 according to the related art, but includes the upper films of the capacitor electrode or the gate insulation film.

With such a configuration, it is possible to design the characteristics of the first storage capacitor independently from the characteristic of the pixel switching element by appropriately setting the film thickness and the specific inductive capacity of the first storage capacitor insulation film (the second insulation film). That is, the storage capacitor with a sufficient capacity value can be formed without restriction on the characteristics of the pixel switching element. Moreover, since it is possible to reliably hold the pixel potential during a period necessary to change a display state, the storage capacitance is not written several times and thus the energy consumption can be considerably reduced.

In the electro-optical device substrate according to the aspect of the invention, each of the plurality of pixels may include a second storage capacitor formed so as to overlap with the first storage capacitor at least partially when viewed from the normal direction of the substrate body. The second storage capacitor may include a second storage capacitor electrode formed of the first conductive film, a second storage insulation film formed of the first insulation film so as to cover at least the second storage capacitor electrode, and the first storage capacitor electrode formed so as to overlap with the second storage capacitor electrode at least partially with the second storage insulation film interposed therebetween when viewed from the normal direction of the substrate body.

With such a configuration, the second storage capacitor is formed so as to overlap with the first storage capacitor at least partially when viewed from the normal direction of the substrate body. Therefore, a capacitance value per unit area is increased by adding the first storage capacitor and the second storage capacitor. Accordingly, it is possible to obtain a sufficient capacitance value without increasing the occupation area.

In the electro-optical device substrate according to the aspect of the invention, a film thickness of the second insulation film may be thinner than a film thickness of the first insulation film.

With such a configuration, since the film thickness of the gate insulation film formed of the first insulation film can be made to be relatively thicker, a leakage current of a TFT of the pixel switching element can be prevented, thereby improving the TFT characteristics. Moreover, since the film thickness of the first storage capacitor insulation film formed of the second insulation film can be made to be relatively thin, it is possible to increase the storage capacitance.

In the electro-optical device substrate according to the aspect of the invention, a part of the source electrode and a part of the drain electrode may be formed over the top of the semiconductor layer, the source electrode may be electrically connected to the source region of the semiconductor layer, and the drain electrode may be electrically connected to the drain region of the semiconductor layer.

With such a configuration, as the pixel switching element, it is possible to realize a so-called top-contact type TFT with a structure in which the source electrode and the drain electrode come into contact with the upper surface of the semiconductor layer.

In the electro-optical device substrate according to the aspect of the invention, an etching stop layer may be disposed in a region corresponding to an upper side of a channel region of the semiconductor layer.

With such a configuration, when the top-contact type TFT is used as the pixel switching element, the etching stop layer protects the channel region of the semiconductor layer from damage from the etching. Accordingly, it is possible to realize a TFT with excellent characteristics.

In the electro-optical device substrate according to the aspect of the invention, a part of the semiconductor layer may be formed over the top of the source electrode and the drain electrode, the source electrode may be electrically connected to the source region of the semiconductor layer, and the drain electrode may be electrically connected to the drain region of the semiconductor layer.

With such a configuration, as the pixel switching element, it is possible to realize a so-called bottom-contact type TFT with a structure in which the source electrode and the drain electrode come into contact with the lower surface of the semiconductor layer. In this case, a manufacturing process of patterning the source electrode and the drain electrode is performed before the semiconductor layer is formed. Therefore, it is possible to form a TFT with excellent characteristics without receiving damage from the etching to the semiconductor layer.

In the electro-optical device substrate according to the aspect of the invention, the semiconductor layer may be formed of any one of non-monocrystalline silicon, an oxide semiconductor material, a transparent oxide semiconductor material, and an organic semiconductor material.

With such a configuration, it is possible to manufacture a TFT with excellent electric characteristics relatively easily using the general manufacturing process.

According to another aspect of the invention, there is provided an electro-optical device including: a pair of substrates; and an electro-optical material layer interposed between the pair of substrates. One of the pair of substrates is the electro-optical device substrate according to the above aspect of the invention.

With such a configuration, since the electro-optical device substrate according to the above aspect of the invention is used as one of the pair of substrates, it is possible to realize the electro-optical device in which a variation in a feed-through voltage is suppressed and display unevenness is small.

According to still another aspect of the invention, there is provided an electronic apparatus including the electro-optical device according to the above aspect of the invention.

According to the aspect of the invention, since the electronic apparatus includes the electro-optical device according to the above aspect of the invention, it is possible to realize the electronic apparatus including a display unit with small display unevenness.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Hereinafter, a first embodiment of the invention will be described with reference to FIGS. 1 to 8.

An electro-optical device according to this embodiment is an example of an active matrix type electrophoretic display device.

Figure 1:
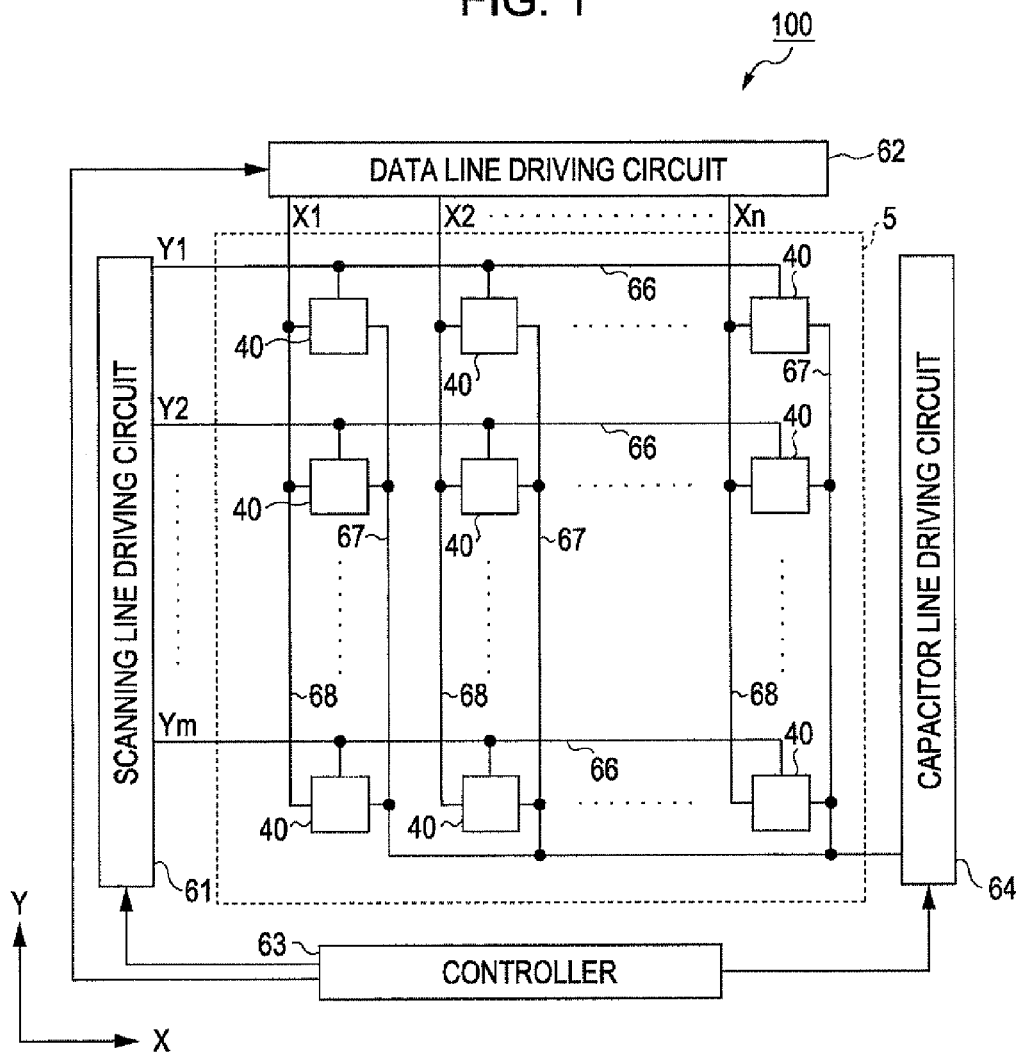
FIG. 1 is an equivalent circuit diagram illustrating an electrophoretic display device according to a first embodiment of the invention.
Figure 2:
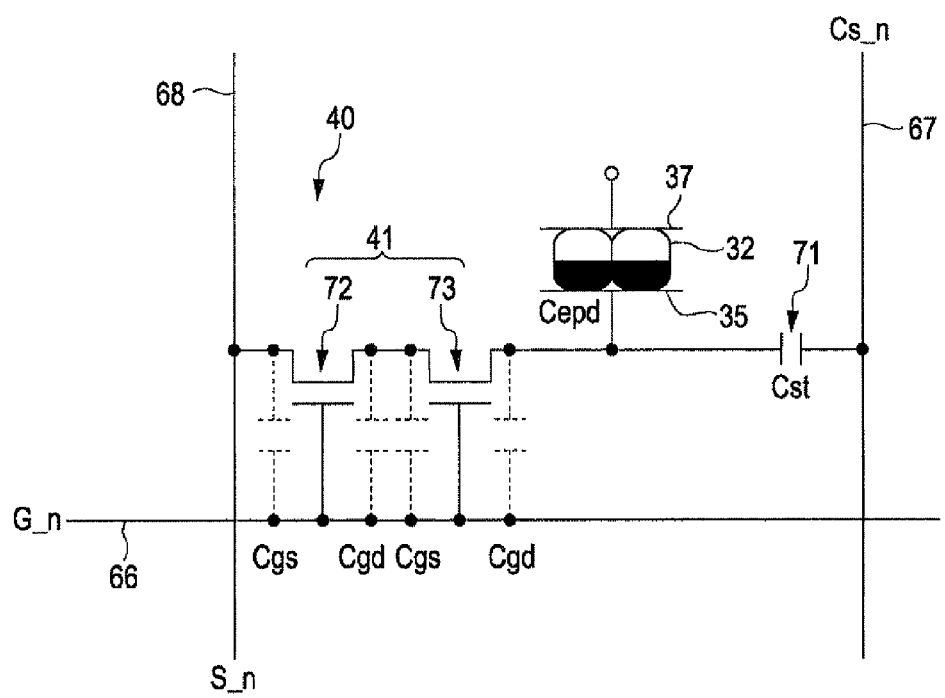
FIG. 2 is an equivalent circuit diagram illustrating each pixel of the electrophoretic display device according to the first embodiment of the invention.
Figure 3A:
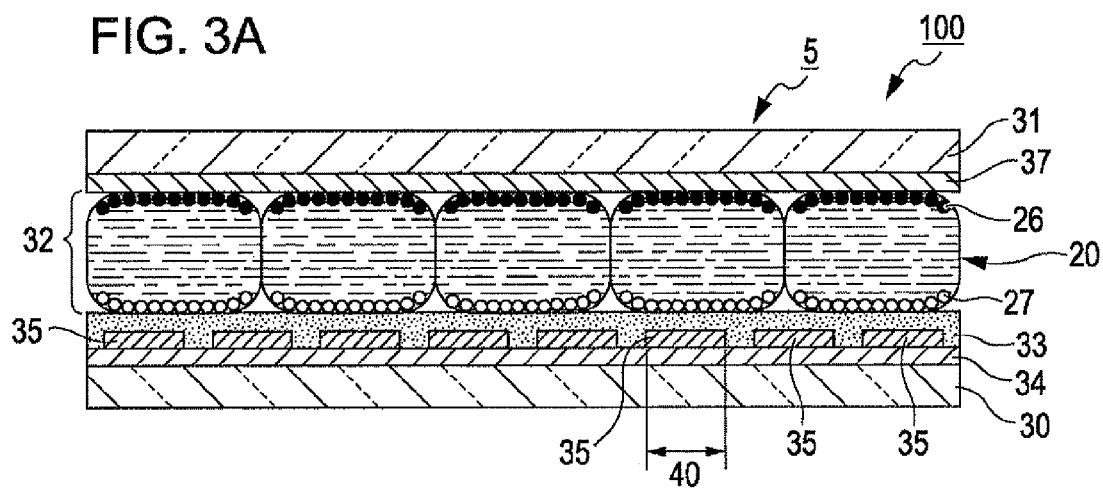
FIG. 3A is a sectional view illustrating the electrophoretic display device.
Figure 3B:
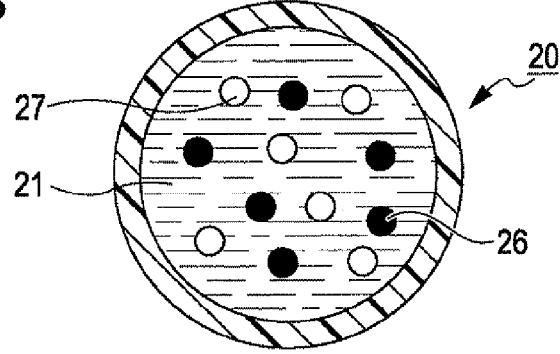
FIG. 3B is a sectional view illustrating a microcapsule.
Figure 3C:
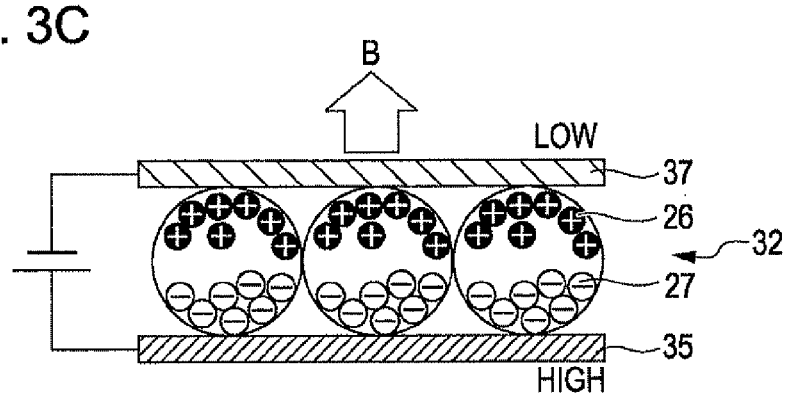
FIG. 3C is a diagram illustrating an operation of an electrophoretic element.
Figure 4A:
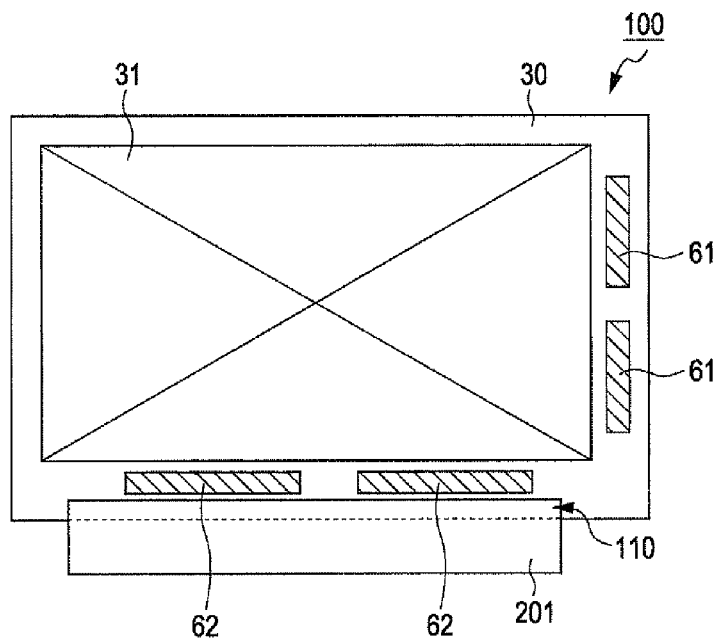
FIGS. 4A and 4B are plan views illustrating the overall configuration of the electrophoretic display device.
Figure 4B:
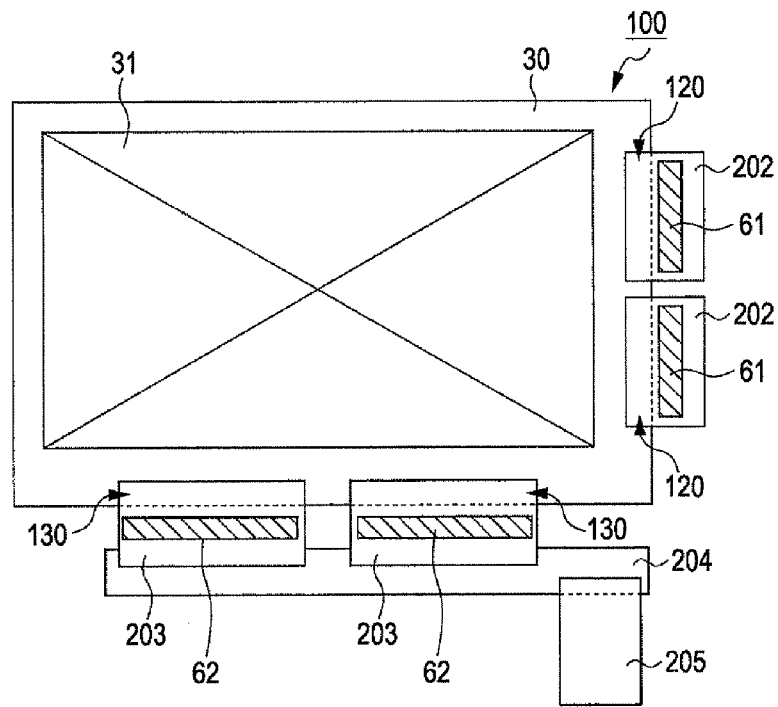
Figure 5:
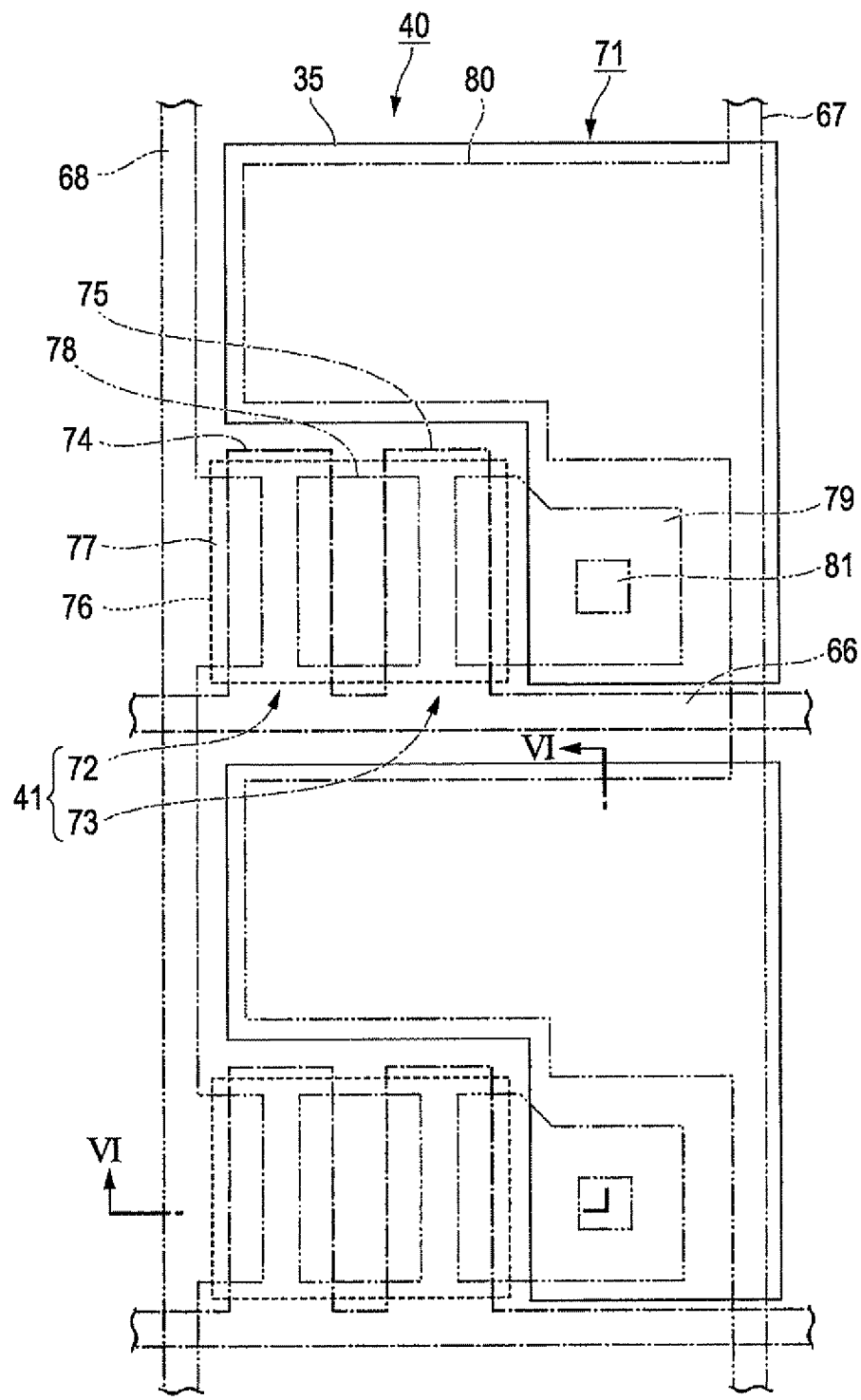
FIG. 5 is a diagram illustrating the plane pattern of each pixel of an element substrate of the electrophoretic display device.
Figure 6:
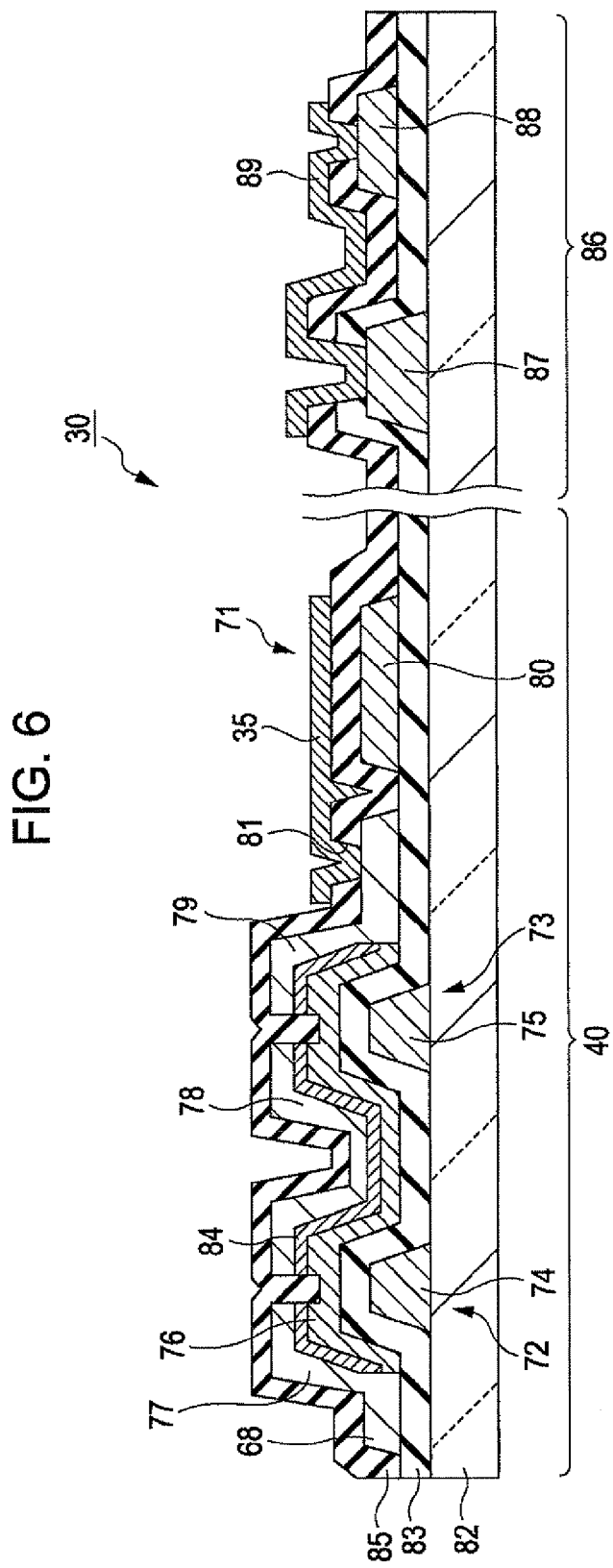
FIG. 6 is a sectional view taken along the line VI-VI of FIG. 5.
Figure 7:
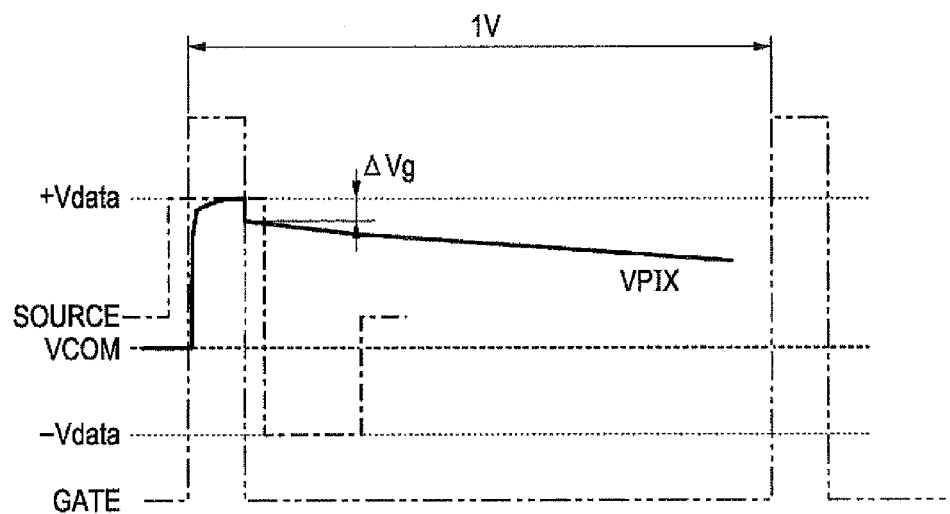
FIG. 7 is a diagram illustrating a feed-through voltage.
Figure 8:
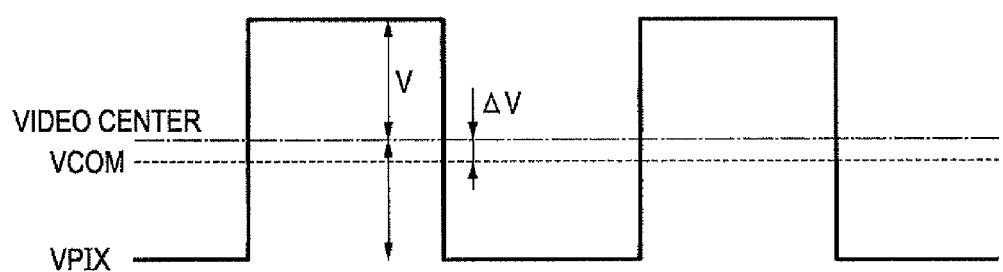
FIG. 8 is a diagram illustrating a common potential.

FIG. 1 is an equivalent circuit diagram illustrating the electrophoretic display device according to this embodiment. FIG. 2 is an equivalent circuit diagram illustrating each pixel of the electrophoretic display device. FIG. 3A is a sectional view illustrating the electrophoretic display device. FIG. 3B is a sectional view illustrating a microcapsule. FIG. 3C is a diagram illustrating an operation of an electrophoretic element. FIGS. 4A and 4B are plan views illustrating the overall configuration of the electrophoretic display device. FIG. 5 is a diagram illustrating the plane pattern of each pixel of an element substrate of the electrophoretic display device. FIG. 6 is a sectional view taken along the line VI-VI of FIG. 5. FIG. 7 is a diagram illustrating a feed-through voltage. FIG. 8 is a diagram illustrating a common potential.

In order to enable easy description of elements in the following drawings, the elements are appropriately shown with different scales.

An electrophoretic display device 100 according to this embodiment includes a display section 5 in which a plurality of pixels 40 are arranged in a matrix form, as shown in FIG. 1. A scanning line driving circuit 61, a data line driving circuit 62, a controller (control unit) 63, and a capacitor line driving circuit 64 are disposed in the periphery of the display section 5. The scanning line driving circuit 61, the data line driving circuit 62, and the capacitor line driving circuit 64 are connected to the controller 63. The controller 63 has overall control of the driving circuit 61, the data line driving circuit 62, and the capacitor line driving circuit 64 based on image data or synchronization signals supplied from a high-level apparatus.

In the display section 5, a plurality of scanning lines 66 extending from the scanning line driving circuit 61 and a plurality of data lines 68 extending from the data line driving circuit 62 are formed and pixels 40 are respectively disposed at intersection positions of the scanning lines and the data lines. Capacitor lines 67 extending from the capacitor line driving circuit 64 are disposed parallel to the data lines 68. The scanning lines 66, the data lines 68, and the capacitor lines 67 are connected to the pixels 40, respectively.

The scanning line driving circuit 61, which is connected to the respective pixels 40 via m scanning lines 66 (Y1, Y2, . . . , and Ym), sequentially selects the scanning lines 66 of the first to m-th rows under the control of the controller 63 and supplies selection signals, which define a timing at which selection transistors 41 (pixel switching elements, see FIG. 2) disposed in the pixels 40 are turned on, via the selected scanning lines 66. The data line driving circuit 62, which is connected to the respective pixels 40 via the n data lines 68 (X1, X2, . . . , and Xn), supplies image signals, which define pixel data respectively corresponding to the pixels 40, to the pixels 40 under the control of the controller 63. The capacitor line driving circuit 64 supplies a predetermined potential to the capacitor lines 67 under the control of the controller 63.

As shown in FIG. 2, the selection transistor 41, a storage capacitor 71, a pixel electrode 35, an electrophoretic element 32, and a common electrode 37 are disposed in each pixel 40. According to this embodiment, a so-called 1T1C (1 Transistor, 1 Capacitor) type pixel circuit including one transistor and one storage capacitor is used as a pixel circuit. However, as the transistor, a double gate type transistor in which two TFTs are connected to each other in series is used. With such a configuration, since a voltage applied to the selection transistor is divided into the two TFTs, the pressure resistance of each TFT can be sufficiently ensured.

The storage capacitor according to this embodiment corresponds to a "first storage capacitor" according to the aspect of the present invention.

As described above, the scanning line 66, the data line 68, and the capacitor line 67 are connected to each pixel 40. The gates of a first TFT 72 and a second TFT 73 forming the selection transistor 41 are connected to the scanning line 66, the source of the first TFT 72 is connected to the data line 68, the drain of the first TFT 72 and the source of the second TFT 73 are connected to each other, and the drain of the second TFT 73 is connected to the pixel electrode 35 and one electrode of the storage capacitor 71. The other electrode of the storage capacitor 71 is connected to the capacitor line 67.

In this embodiment, between the source and drain of each of the TFTs 72 and 73, the side (the side closer to the data line 68) connected to the data line 68 is called a source and the side (the side closer to the pixel electrode 35) connected to the pixel electrode 35 is called a drain, but the source and drain are determined for facilitating easy description. Instead, the source and drain of each of the TFTs 72 and 73 may be named conversely.

In this embodiment, it is assumed that an n channel type transistor is used as the selection transistor 41, but another kind of switching element having the same function as that of the n channel type transistor may be used. For example, instead of the n channel type transistor, a p channel type transistor may be used, or an inverter or a transmission gate may be used.

In each pixel 40, an image signal is input from the data line 68 to the pixel electrode 35 via the selection transistor 41 and the storage capacitor 71 is charged, when the selection transistor 41 is turned on by a selection signal input via the scanning line 66. In addition, the energy stored in the storage capacitor 71 enables the pixel electrode 35 to be held at a predetermined potential level, and thus the electrophoretic element 32 is driven by a potential difference between the pixel electrode 35 and the common electrode 37.

In the electrophoretic display device 100, as shown in FIG. 3A, an element substrate 30 and a counter substrate 31 interpose the electrophoretic element 32 in which a plurality of microcapsules 20 are arranged. In the display section 5, a circuit layer 34, in which the scanning lines 66, the data lines 68, and the selection transistors 41 shown in FIG. 1 or 2 are formed, is formed in the element substrate 30 closer to the electrophoretic element 32. In addition, the plurality of pixel electrodes 35 is formed on the circuit layer 34. In FIG. 3A, the specific constituent elements in the circuit layer 34 are not illustrated.

The element substrate 30 (electro-optical device substrate) is a substrate made of glass, plastic, or the like. Since the element substrate 30 is disposed on the opposite side to an image display surface, the element substrate 30 may not be transparent. The pixel electrode 35 is made of a transparent conductive material such as ITO (indium tin oxide) or a metal material such as Al. The pixel electrode 35 is an electrode which applies a voltage to the electrophoretic element 32 between the common electrode 37 and the pixel electrode 35.

On the other hand, a planar common electrode 37 facing the plurality of pixel electrodes 35 is formed in the counter substrate 31 closer to the electrophoretic element 32. The electrophoretic element 32 is disposed on the common electrode 37. The counter substrate 31 is made of glass, plastic, or the like. Since the counter substrate 31 is disposed on the side of the image display surface, a transparent substrate is used as the counter substrate 31. The common electrode 37 is an electrode which applies a voltage to the electrophoretic element 32 together with the pixel electrode 35. The common electrode 37 is a transparent electrode made of MgAg (magnesium-silver), ITO, IZO (Indium Zinc Oxide), or the like.

The element substrate 30 and the counter substrate 31 are adhered by attaching the electrophoretic element 32 and the pixel electrode 35 to each other with an adhesive layer 33 interposed therebetween.

In general, the electrophoretic element 32 is treated as an electrophoretic sheet formed in advance on the side of the counter substrate 31 and including up to the adhesive layer 33. In a manufacturing process, the electrophoretic sheet is treated as a sheet in which a protective release sheet is attached on the surface of the adhesive layer 33. The display section 5 is formed by attaching the electrophoretic sheet, from which the release sheet is removed, to the separately manufactured element substrate 30 (in which the pixel electrode 35, various kinds of circuit, and the like are formed). Therefore, the adhesive layer 33 is present only on the side of the pixel electrode 35.

As shown in FIG. 3B, the microcapsule 20 has a particle diameter of, for example, about 50 μm and has a spherical shape in which a dispersion medium 21, a plurality of white particles (electrophoretic particles) 27, and a plurality of black particles (electrophoretic particles) 26 are enclosed. As shown in FIG. 3A, the microcapsule 20 is interposed between the common electrode 37 and the pixel electrodes 35 and one or a plurality of microcapsules 20 is arranged in one pixel 40.

The outer shell (wall membrane) of the microcapsule 20 is made of transparent polymer resin such as acryl resin such as polymethyl methacrylate and polyethyl methacrylate, urea resin, and gum arabic.

The dispersion medium 21 is a liquid for dispersing the white particles 27 and the black particles 26 in the microcapsule 20.

Examples of the dispersion medium 21 include water, alcoholic solvent (such as methanol, ethanol, isopropanol, butanol, octanol, and methyl cellosolve), esters (such as ethyl acetate and butyl acetate), ketones (such as acetone, methylethyl ketone, and methyl isobutyl ketone), aliphatic hydrocarbons (such as pentane, hexane, and octane), alicyclic hydrocarbons (such as cyclohexane and methyl cyclohexane), aromatic hydrocarbons (such as benzene, toluene, and benzenes having a long-chain alkyl group (such as xylene, hexyl benzene, heptyl benzene, octyl benzene, nonyl benzene, decyl benzene, undecyl benzene, dodecyl benzene, tridecyl benzene, and tetradecyl benzene)), halogenated hydrocarbons (such as methylene chloride, chloroform, carbon tetrachloride, and 1,2-dichloroethane), carboxylate salts, and other oily substances. These materials may be used singly or as a mixture and may be mixed with surfactants and the like.

The white particles 27 are particles (polymer or colloidal) formed of white pigments such as titanium dioxide, zinc oxide, and antimony trioxide and are charged to, for example, negative polarity for use. The black particles 26 are particles (polymer or colloidal) formed of black pigments such as aniline black and carbon black and are charged to, for example, positive polarity for use.

A charging control agent including particles of electrolyte, surfactant, metal soap, resin, rubber, oil, varnish, or compound, a dispersion solvent such as titanium coupling agent, aluminum coupling agent, and silane coupling agent, lubricant, and stabilizer may be added to the pigments as needed.

For example, red, green, blue, yellow, cyan, and magenta pigments may be used instead of the black particles 26 and the white particles 27. With such a configuration, red, green, blue, yellow, cyan, magenta, and the like can be displayed on the display section 5.

When the pixels 40 are allowed to display a black color in the electrophoretic element 32 having the above-described configuration, as shown in FIG. 3C, the common electrode 37 is held at a relatively low potential and the pixel electrode 35 is held with a relatively high potential. That is, when the potential of the common electrode 37 serves as a reference potential, the pixel electrodes 35 are held with a positive polarity. Accordingly, the white negatively charged particles 27 are attracted to the pixel electrode 35, whereas the black positively charged particles 26 are attracted to the common electrode 37. As a consequence, when the pixels are viewed from the common electrode 37, the black color is recognized. On the other hand, when the pixels 40 are allowed to display a white color, the common electrode 37 is held with a relatively high potential and the pixel electrode 35 is held with a relatively low potential. The pixel electrode 35 is set to have a negative polarity with respect to the potential of the common electrode 37. Accordingly, the white negatively charged particles 27 are attracted to the common electrode 37. When the pixels are viewed from the display surface, the white color is recognized.

FIGS. 4A and 4B are diagrams illustrating two examples of the overall configuration of the electrophoretic display device 100.

In the example shown in FIG. 4A, the element substrate 30 has a larger planar size than that of the counter substrate 31 which is the electrophoretic sheet. Therefore, two scanning line driving circuits 61 and two data line driving circuit 62 are COG (Chip On Glass)-mounted on the outer sides of the element substrate 30 with respect to the counter substrate 31. There is a terminal formation region 110 in the side edge portion near the data line driving circuits 62. A flexible substrate 201 used to connect an external apparatus is attached to the terminal formation region 110 through an ACP (Anisotropic Conductive Paste) or an ACF (Anisotropic Conductive Film).

In the example shown in FIG. 4A, the display section 5 is formed in the region where the element substrate 30 and the counter substrate 31 overlap with each other. Therefore, the scanning lines 66 and the data lines 68 extending from the display section 5 expand to the regions where the scanning line driving circuits 61 and the data line driving circuits 62 are mounted and are connected to connection terminals formed in the mounting regions. In addition, the scanning line driving circuits 61 and the data line driving circuits 62 are mounted for the connection terminals via the ACP or the ACF.

On the other hand, in the example shown in FIG. 4B, the scanning line driving circuits 61 and the data line driving circuits 62 are not mounted on the element substrate 30, but are COF (Chip On Film) (or TAB (Tape Automated Bonding)) mounted on flexible substrates 202 and 203. In addition, the flexible substrates 202 each mounted with the scanning line driving circuit 61 are mounted in terminal formation regions 120 formed in the side edge portion along one short side of the element substrate 30 via the ACP or the like. In addition, the flexible substrates 203 each mounted with the data line driving circuit 62 are mounted in terminal formation regions 130 formed in the side edge portion along one long side of the element substrate 30 via the ACP or the like. A plurality of connection terminals are formed in each of the terminal formation regions 120 and 130. The scanning lines 66 and the data lines 68 expanding from the display section 5 are connected to the connection terminals. In addition, the flexible substrates 203 each mounted with the data line driving circuit 62 are also connected to a rigid substrate 204. A flexible substrate 205 for external connection is connected to the rigid substrate 204.

Next, the configuration of the element substrate 30 (the electrophoretic device substrate) which is the essence of the invention will be described.

In the element substrate 30, as shown in the plane pattern of FIG. 5, the data lines 68 vertically extending in FIG. 5 and the scanning lines 66 extending horizontally in FIG. 5 intersect with each other, and a region partitioned by two adjacent data lines 68 and two adjacent scanning lines 66 is one pixel 40. The selection transistor 41 including the first TFT 72 and the second TFT 73 is disposed at one corner of the rectangular pixel 40 and the pixel electrode 35 is disposed in the region which does not overlap with the selection transistor 41 in a plan view.

A gate electrode 74 of the first TFT 72 and a gate electrode 75 of the second TFT 73 branch off from the scanning line 66 and a semiconductor layer 76 is formed over the top of the gate electrode 74 of the first TFT 72 and the gate electrode 75 of the second TFT 73. A source electrode 77 of the first TFT 72 branches off from the data line 68 and is formed so as to partially overlap with the gate electrode 74 of the first TFT 72. An electrode 78 (hereinafter, referred to as a source/drain electrode 78 for convenience) serving as both a drain electrode of the first TFT 72 and a source electrode of the second TFT 73 is formed so as to partially overlap with the gate electrode 74 of the first TFT 72 and the gate electrode 75 of the second TFT 73. A drain electrode 79 of the second TFT 73 is formed so as to partially overlap with the gate electrode 75 of the second TFT 73.

That is, when the first TFT 72 and the second TFT 73 are considered as one selection transistor 41, the source electrode 77 of the first TFT 72 branching off from the data line 68 corresponds to the source electrode of the selection transistor 41. In addition, the two gate electrodes 74 and 75 of the first TFT 72 and the second TFT 73 correspond to the gate electrode of the double gate type selection transistor 41. In addition, the drain electrode 79 of the second TFT 73 corresponds to the drain electrode of the selection transistor 41.

The capacitor line 67 extends vertically in FIG. 5 so as to be substantially parallel to the data line 68. Within each pixel 40, the storage capacitor electrode 80 is formed integrally with the capacitor line 67 so as to partially overlap with the pixel electrode 35. A portion overlapping with a part of the pixel electrode 35 of the storage capacitor electrode 80 in a plan view is the storage capacitor 71 of each pixel 40. The drain electrode 79 and the pixel electrode 35 are formed so as to partially overlap with each other and a contact hole 81 is formed in the overlapping portion to electrically connect the drain electrode 79 to the pixel electrode 35.

The cross-section structures of the first TFT 72, the second TFT 73, and the storage capacitor 71 are shown in FIG. 6. In FIG. 6, the cross-section structure of the pixel 40 is shown on the left side of the omission portion and the cross-section structure of a part (protective circuit section) of a peripheral circuit section 86 is shown on the right side thereof.

As shown in FIG. 6, the selection transistor 41 including the first TFT 72 and the second TFT 73, the pixel electrode 35, the storage capacitor electrode, the scanning line 66, the data line 68, and the like are formed on the surface on which the electrophoretic element 32 of a substrate body 82 forming the element substrate 30 is formed.

The gate electrodes 74 and 75 formed of a first conductive film are formed on the substrate body 82. Although not illustrated in FIG. 6, the scanning lines 66 integrated with the gate electrodes 74 and 75 are also formed on the substrate body 82. The substrate body 82 is a substrate made of glass, plastic, or the like. Since the substrate body 82 is disposed on the opposite side to the image display surface, the substrate body 82 may not be transparent. In particular, when an organic TFT having an organic semiconductor layer is used as the selection transistor 41, a plastic substrate is preferably used in terms of low cost, lightness, and high flexibility. A metal laminate film or the like of, for example, an Al—Nd alloy and Mo may be used as the material of the first conductive film forming the gate electrodes 74 and 75 and the scanning line 66. Moreover, a single substance of Al, ITO, Cu, Cr, Ta, Mo, Nb, Ag, Pt, Pd, In, Nd, or an alloy thereof may be used.

A gate insulation film 83 formed of a first insulation film is formed on the entire surface of the substrate body 82 so as to cover the gate electrodes 74 and 75. A silicon nitride film with a film thickness of, for example, 400 nm may be used as the material of the first insulation film forming the gate insulation film 83. Moreover, an inorganic insulation material or an organic insulation material such as a silicon oxide film or a silicon nitride oxide film may be used as the material of the first insulation film. The semiconductor layer 76 is formed on the surface of the gate insulation film 83 corresponding to the upper side of the gate electrodes 74 and 75. N$^+$ semiconductor layers 84 implanted with N type impurities such as phosphorous among semiconductor materials are formed in both ends of the semiconductor layers 76. The N+ semiconductor layers 84 function as a source region and a drain region, respectively. A non-monocrystalline silicon material such as amorphous silicon or multi-crystalline silicon, an oxide semiconductor material, a transparent oxide semiconductor material such as In—Ga—Zn—O, an organic semiconductor material such as fluorine-bithiophene copolymer may be used as the material of the semiconductor layer 76. When an oxide semiconductor material is used in the semiconductor layer 76, an oxide insulation material is preferably used even in the gate insulation film 83 (the first insulation film). In addition, when an organic semiconductor material is used in the semiconductor layer 76, an organic insulation material is preferably used even in the gate insulation film 83 (the first insulation film).

The source electrode 77, the source/drain electrode 78, and the drain electrode 79 formed of the second conductive film are formed on the gate insulation film 83 so as to be formed over the top of the surface of the semiconductor layer 76. The source electrode 77, the source/drain electrode 78, and the drain electrode 79 come into direct contact with the N+ semiconductor layer 84 so as to be electrically connected to the source region and the drain region of the TFTs 72 and 73, respectively. That is, a so-called bottom-gate top-contact type TFT is used as the first TFT 72 and the second TFT 73 according to this embodiment.

The storage capacitor electrode 80 formed of the second conductive film formed in the same layer of that of the source electrode 77 and the like is formed on the gate insulation film 83 corresponding to the side of the second TFT 73. Although not illustrated in FIG. 6, the capacitor line 67 integrated with the storage capacitor electrode 80 is formed on the gate insulation film 83. A metal laminate film such as Mo/Al/Mo can be used as the material of the second conductive film forming the source electrode 77, the source/drain electrode 78, the drain electrode 79, and the storage capacitor electrode 80 (the capacitor line 67). Moreover, the same material as that of the first conductive film forming the gate electrodes 74 and 75 may be also used.

The storage capacitor electrode 80 according to this embodiment corresponds to a "first storage capacitor electrode" according to the aspect of the present invention.

A protective film 85 formed of the second insulation film is formed on the entire surface of the gate insulation film 83 so as to cover the source electrode 77, the source/drain electrode 78, the drain electrode 79, and the storage capacitor electrode 80 (the capacitor line 67). The protective film 85 basically serves as a film which insulates and protects the TFTs 72 and 73. In this embodiment, the protective film 85 is interposed between the storage capacitor electrode 80 and the pixel electrode 35 and a facing portion thereof functions as a storage capacitor insulation film of the storage capacitor 71. A silicon nitride film with a film thickness of, for example, 150 nm can be used as the material of the second insulation film forming the protective film 85. In this embodiment, therefore, the film thickness of the protective film 85 is set to be thinner than the film thickness of the gate insulation film 83. In addition, the same insulation material, such as an inorganic insulation material such as a silicon oxide film, as that of the first insulation film can be used as another material of the protective film 85. Alternatively, an organic insulation material such as acrylic resin may be used.

The storage capacitor insulation film according to this embodiment corresponds to a "first storage capacitor insulation film" according to the aspect of the present invention.

The contact hole 81 perforated through the protective film 85 and reaching the drain electrode 79 is formed and the pixel electrode 35 is formed on the protective film 85 so as to be formed inside the contact hole 81. With such a configuration, the drain electrode 79 and the pixel electrode 35 are electrically connected to each other through the contact hole 81. A transparent conductive material such as ITO can be used as the material of the pixel electrode 35. Alternatively, since the pixel electrode 35 is located on the opposite side to a viewing side of the electrophoretic element 32, the material of the pixel electrode 35 may not be a transparent material and a metal material such as Al may be used. Alternatively, a laminate film thereof may be used.

FIG. 6 is a diagram illustrating the protective circuit section as an example of the peripheral circuit section 86. The protective circuit section includes a first electrode 87 formed of the first conductive film formed in the same layer of the gate electrodes 74 and 75, a second electrode 88 formed of the second conductive film formed in the same layer of the source electrode 77 and the like, and a short circuit line 89 electrically short-circuiting the first electrode 87 and the second electrode 88.

Hereinafter, a process of manufacturing the element substrate with the above-described configuration will be described.

Initially, a first conductive film formed of a metal laminate film of Al—Nd with a film thickness of 150 nm and Mo with a film thickness of 20 nm is formed on one surface of the substrate body 82 made of glass, plastic, or the like from the lower layer side by a sputtering method.

Next, the first conductive film is patterned by a photolithographic method or an etching method to form the scanning lines 66 and the gate electrodes 74 and 75.

Next, three layers, that is, a silicon nitride film with a film thickness of 400 nm which becomes the gate insulation film 83 (the first insulation film), a non-doped amorphous silicon film with a film thickness of 150 nm which becomes the semiconductor layer 76, and an amorphous silicon film doped with phosphorous of a film thickness of 50 nm which becomes the N+ semiconductor layer 84 are continuously formed without breaking the vacuum of a chamber by a plasma CDV method. The first TFT 72 and the second TFT 73 according to this embodiment are of a reverse staggered type. In particular, it is possible to obtain a clean interface by continuously forming the gate insulation film 83 and the semiconductor layer 76 which becomes a channel region, thereby improving reproducibility or stability of the TFT characteristics.

Next, the gate insulation film 83 remains among the three layers formed in the previous process by a photolithographic method or an etching method. The non-doped amorphous silicon film and the amorphous silicon film doped with phosphorous are selectively patterned to form the semiconductor layer 76 and the N+ semiconductor layer 84. Dry etching using an etching gas containing $SF_6$ is used for the etching of this process. At this time, it is preferable to suppress the damage to the gate insulation film 83 to be as low as possible by using a plasma mode.

Next, the second conductive film formed by the metal laminate film of Mo with a film thickness of 5 nm, Al with a film thickness of 150 nm, and Mo with a film thickness of 50 nm is formed from the lower layer side by a sputtering method.

Next, the second conductive film is patterned by a photolithographic method or an etching method to form the source electrodes 77, the source/drain electrodes 78, the drain electrodes 79, the storage capacitor electrodes 80, and the capacitor lines 67.

Next, the N+ semiconductor layer 84 between the source electrode 77 and the source/drain electrode 78 of the first TFT 72 and between the source/drain electrode 78 and the drain electrode 79 of the second TFT 73 is selectively removed to separate the source region from the drain region by a dry etching method.

Next, a silicon nitride film with a film thickness of 150 nm which becomes the protective film 85 (the second insulation film) is formed by a plasma CVD.

Next, the contract hole 81 is formed by a photolithographic method or an etching method so as to be perforated through the protective film 85 in the overlapping portion between the drain electrode 79 and the pixel electrode 35 subsequently formed and to be opened and reach the surface of the drain electrode 79. Dry etching using an etching gas containing $SF_6$ is used for the etching of this process.

Finally, a transparent conductive film formed of ITO with a film thickness of 100 nm is formed by a sputtering method.

Next, the transparent conductive film is patterned by a photolithographic method or a wet etching method to form the pixel electrodes 35.

The element substrate 30 according to this embodiment is completed by the above-described processes.

In this embodiment, the storage capacitor 71 does not include the capacitor electrode or the gate insulation film formed in the same layer as that of the scanning line, as disclosed in Japanese Patent No. 4275671 and JP-A-2005-346090 according to the related art, but includes the upper films of the capacitor electrode or the gate insulation film, that is, the storage capacitor electrode 80, the protective film 85, and the pixel electrode 35 formed in the same layer as that of the source electrode 77 and the like. Therefore, it is possible to design the characteristics of the storage capacitor 71 independently from the characteristics of the selection transistor 41 including the first TFT 72 and the second TFT 73 by appropriately setting the film thickness and the specific inductive capacity of the protective film 85[0]. That is, the storage capacitor 71 with a sufficient capacity value can be formed without restriction on the characteristics of the selection transistor 41. As a consequence, it is possible to suppress a variation in the feed-through voltage and realize the electrophoretic display device with less display unevenness.

Hereinafter, the feed-through voltage will be described with reference to FIGS. 2 and 7.

In a TFT, there is a parasitic capacitance caused due to the structure. A sign of the capacitor indicated by a dotted line in FIG. 2 represents a parasitic capacitance. About half of the capacitance formed in the channel region when the TFT is turned on corresponds to a parasitic capacitance Cgd between the gate and drain formed in the overlapping portion between the gate electrode and the drain electrode. At this time, when it is assumed that Cst is the storage capacitor, Cepd is an electrophoretic element capacitor, Vgh is a high level of a gate voltage, and Vgl is low level of the gate voltage, a feed-through voltage ΔVg is expressed as follows by a ratio between the parasitic capacitance Cgd between the gate and drain and a pixel capacitance Cpix (=Cgd+Cst+Cepd).

$$\Delta Vg = (Cgd / Cpix) \times (Vgh - Vgl) \quad (1)$$
$$= (Cgd / (Cgd + Cst + Cepd)) \times (Vgh - Vgl)$$

A pixel effective voltage VPIX-VCOM when the feed-through voltage ΔVg is fluctuated by ΔV due to manufacturing variation such as processing variation is shown in FIG. 8.

When the pixel effective voltage is expressed by a mathematical expression, the expression is different in a case of an alternate current-driving liquid crystal display device and in a case of a direct current-driving electrophoretic display device and thus is expressed as Expression (2) and Expression (3).

Formula 1

$$LCD; \quad |VPIX - VCOM|_{eff} = \sqrt{\frac{(V + \Delta V)^2 + (V - \Delta V)^2}{2}} = \sqrt{V^2 + \Delta V^2} = V + \frac{(\Delta V)^2}{2V} \quad (2)$$

$$EPD; \quad VPIX - VCOM = V \pm \Delta V \quad (3)$$

As apparent from Expression (2) and Expression (3), there is rarely an influence on the pixel effective voltage in the liquid crystal display device when the feed-through voltage variation ΔV satisfies "ΔV<1". On the contrary, in the case of the electrophoretic display device ±ΔV has a direct influence on the variation in the pixel effective voltage. In particular, display unevenness is recognized when a half tone display is performed. Therefore, it is important to reduce the feed-through voltage variation ΔV in order to improve display regularity.

In order to reduce the feed-through voltage variation ΔV, it is effective to suppress the variation in the parasitic capacitance Cgd between the gate and the drain caused to a manufacturing variation or the like and to increase the storage capacitor Cst from Expression (1).

In the electrophoretic display device 100 according to this embodiment, the protective 85 formed of a silicon nitride film with a film thickness of 150 nm is used as the nitride film with a film thickness of 150 nm is used as the storage capacitor insulation film. Therefore, since the capacitance value per unit area can be increased, a sufficiently large storage capacitance can be formed. As a consequence, since the feed-through voltage variation ΔV can be reduced, the variation in the pixel potential is suppressed, thereby realizing the electrophoretic display device with small display unevenness.

Since the area of the overlapping portion between the pixel electrode and the storage capacitor electrode is associated with the storage capacitance value, it is desirable to reduce a processing variation such as an alignment variation between the pixel electrode 35 and the storage capacitor electrode 80.

Next, the energy consumption of the electrophoretic display device will be described.

In general, when it is assumed that P is power consumption, f is a driving frequency, C is capacitance, and V is an application voltage, a relation of P="fCV²" is satisfied. The driving of the data line in which the driving frequency if is high and the application voltage V is large account for most of the power consumption P. The driving voltage, such as about 15 V, of the electrophoretic display device is larger than the driving voltage, such as about 5 V, of a liquid crystal display device. Therefore, the power consumption for driving the data lines is larger than that of the liquid crystal display device. On the other hand, the energy consumption is expressed by a product of the power consumption and a driving time. Refresh driving for maintaining the display is not necessary in the electrophoretic display device which has a display memory property. Therefore, in a usage method in which a rewriting frequency is small, the energy consumption can be reduced more than that of the liquid crystal display device.

Accordingly, since a sufficiently large storage capacitance is formed in the electrophoretic display device 100 according to this embodiment, it is possible to reliably hold the pixel potential during a period necessary to change a display state. That is, it is possible to reliably hold the pixel potential just by writing the storage capacitance once without writing the storage capacitance several times. Accordingly, since driving for refreshing the pixel voltage is not necessary, the energy for charging the data line can be reduced, thereby considerably reducing the energy consumption.

Second Embodiment

Hereinafter, a second embodiment of the invention will be described with reference to FIGS. 9 to 11.

An electro-optical device according to this embodiment is an example of the active matrix type electrophoretic display device, as in the first embodiment.

The basic configuration of the electrophoretic display device of this embodiment is the same as that of the first embodiment. The configuration of the electrophoretic display device according to this embodiment is different from that of the first embodiment in that each pixel includes two laminated storage capacitors.

Figure 9:
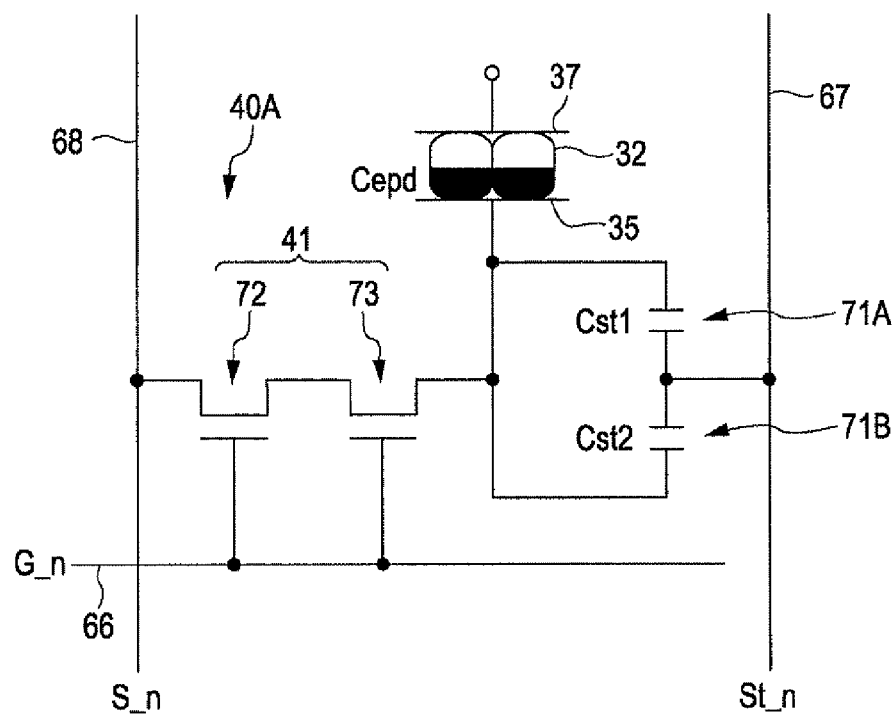
FIG. 9 is an equivalent circuit diagram illustrating each pixel of an electrophoretic display device according to a second embodiment of the invention.

FIG. 9 is an equivalent circuit diagram illustrating each pixel of the electrophoretic display device according to this embodiment of the invention. FIG. 10 is a diagram illustrating the plane pattern of each pixel of an element substrate of the electrophoretic display device according to the second embodiment of the invention. FIG. 11 is a sectional view taken along the line XI-XI of FIG. 10.

Figure 10:
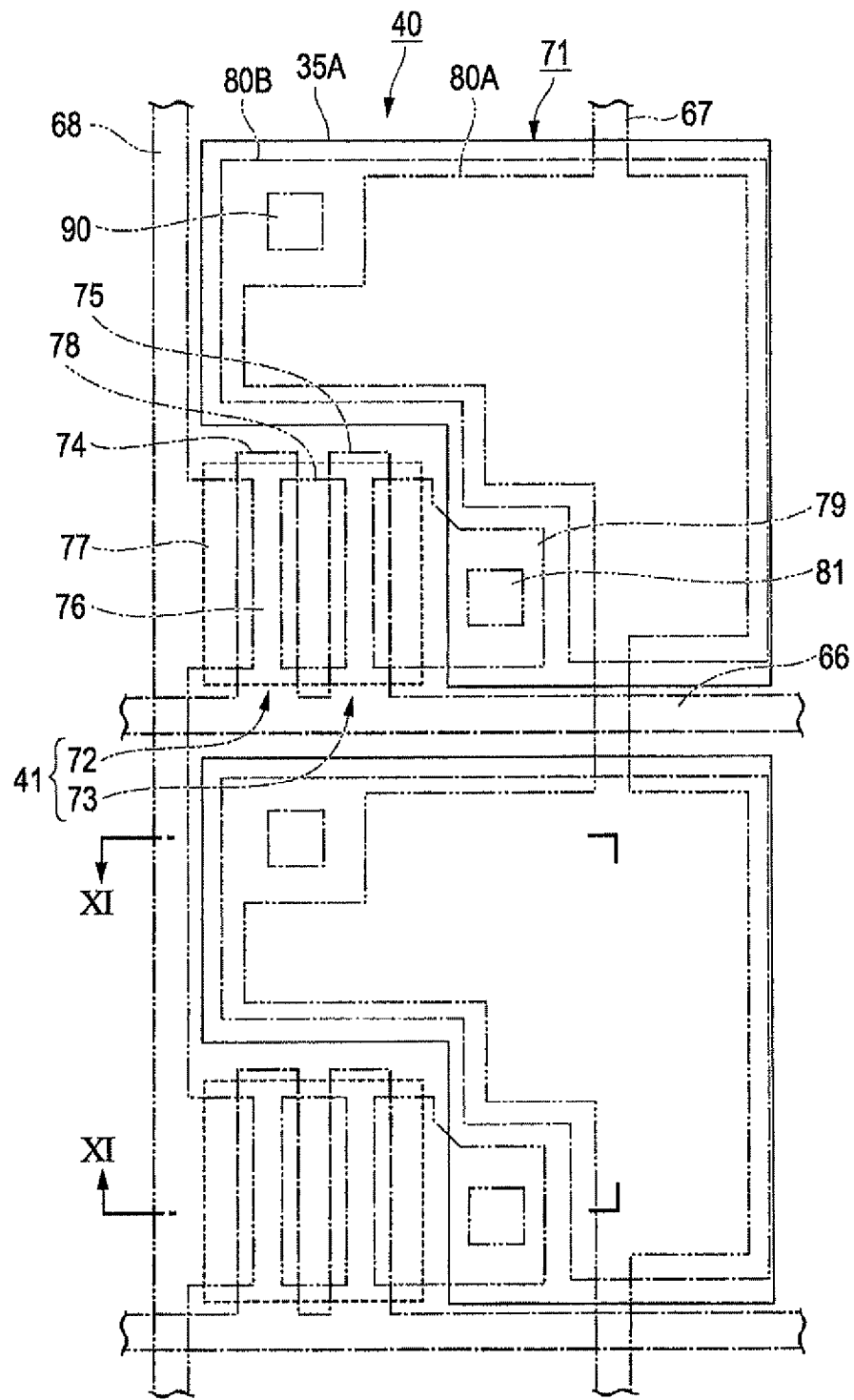
FIG. 10 is a diagram illustrating the plane pattern of each pixel of an element substrate of the electrophoretic display device according to the second embodiment of the invention.
Figure 11:
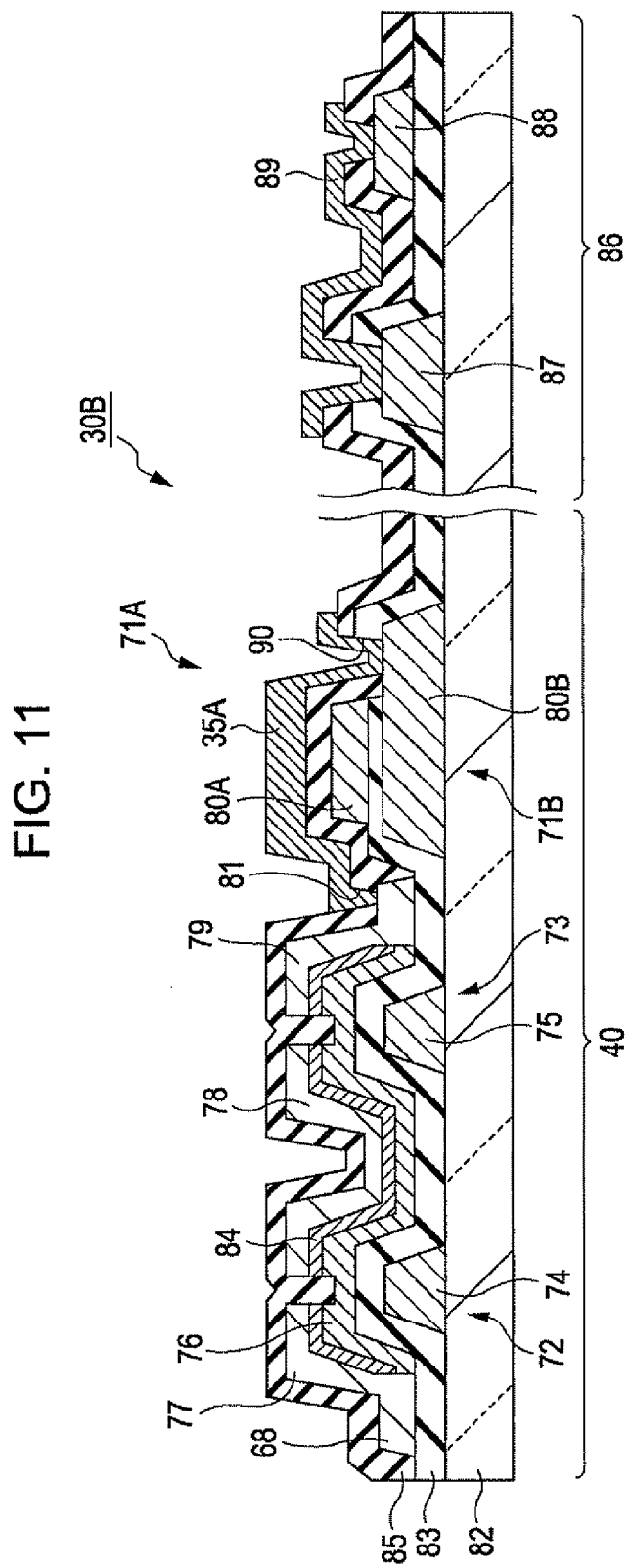
FIG. 11 is a sectional view taken along the line XI-XI of FIG. 10.

In FIGS. 9 to 11, the same reference numerals are given to the same constituent elements as those shown in FIGS. 2, 5, and 6 according to the first embodiment, and the detailed description thereof will not be repeated.

In the electrophoretic display device according to this embodiment, as shown in FIG. 9, each pixel 40A includes two storage capacitors 71A and 71B connected to each other in parallel. One electrode of the first storage capacitor 71A and one electrode of the second storage capacitor 71B are electrically connected to the pixel electrode 35. The other electrode of the first storage capacitor 71A and the other electrode of the second storage capacitor 71B are electrically connected to the capacitor line 67.

As shown in the plane pattern of FIG. 10, a second storage capacitor electrode 80B having a contour in the inside of the pixel electrode 35A and in the outside of the first storage capacitor electrode 80A is formed. Since the left upper corner of the first storage capacitor electrode 80A in FIG. 10 is notched, the pixel electrode 35A and the second storage capacitor electrode 80B overlap with each other in a plan view and a portion which does not overlap with the first storage capacitor electrode 80A is formed. In this portion, a contact hole 90 is formed to electrically connect the pixel electrode 35A to the second storage capacitor electrode 80B. The other configuration is substantially the same as the configuration of the first embodiment in FIG. 5.

As shown in the cross-sectional configuration of the element substrate 30B of FIG. 11, this embodiment is the same as the first embodiment in that the first storage capacitor 71A includes a first storage capacitor electrode 80A formed of a second conductive film formed in the same layer as that of the source electrode 77 and the like, a first capacitor insulation film formed of the protective film 85, and a portion of the pixel electrode 35A overlapping with the first storage capacitor electrode 80A in a plan view. This embodiment is different from the first embodiment in that the second storage capacitor 71B is formed in the lower layer of the first storage capacitor 71A and the first storage capacitor 71A is laminated above the second storage capacitor 71B.

The second storage capacitor 71B includes a second storage capacitor electrode 80B formed of a first conductive film formed in the same layer as that of the gate electrodes 74 and 75 and the scanning line 66, a first storage capacitor electrode 80A, and a gate insulation film 83 interposed between the second storage capacitor electrode 80B and the first storage capacitor electrode 80A and functioning as a second storage capacitor insulation film. The contact hole 90 perforated through the protective film 85 and the gate insulation film 83 and reaching the surface of the second storage capacitor electrode 80B is formed. The pixel electrode 35A and the second storage capacitor electrode 80B are electrically connected to each other via the contact hole 90. That is, in the first storage capacitor 71A and the second storage capacitor 71B according to this embodiment, the pixel electrode 35A and the second storage capacitor electrode 80B serving as one electrode of the respective storage capacitors have the same potential. Therefore, a potential is supplied from the capacitor line 67 to the first storage capacitor electrode 80A common to the both storage capacitors.

The material and the film thickness of each film of this embodiment are the same as those of the first embodiment. The manufacturing process is the same as that of the first embodiment. In addition, the second storage capacitor electrode 80B may be simultaneously formed in the process of forming the gate electrodes 74 and 75 and the scanning line 66. Therefore, only the design of a photomask is changed and the manufacturing process is not increased.

In this embodiment, the first storage capacitor 71A is laminated on the second storage capacitor 71B. The sum of the capacitance values of the two storage capacitors 71A and 71B is the storage capacitance value of the entire pixel. Therefore, a larger capacitance value can be obtained without increasing the occupation area of the storage capacitor, compared to the configuration of the first embodiment. As a consequence, since the variation in the feed-through voltage is further suppressed, it is possible to realize the electrophoretic display device with small display unevenness.

Third Embodiment

Hereinafter, a third embodiment of the invention will be described with reference to FIG. 12.

An electro-optical device according to this embodiment is also an example of the active matrix type electrophoretic display device, as in the first and second embodiments.

The basic configuration of the electrophoretic display device of this embodiment is the same as that of the second embodiment. The storage capacitor of each pixel includes two laminated storage capacitors.

Figure 12:
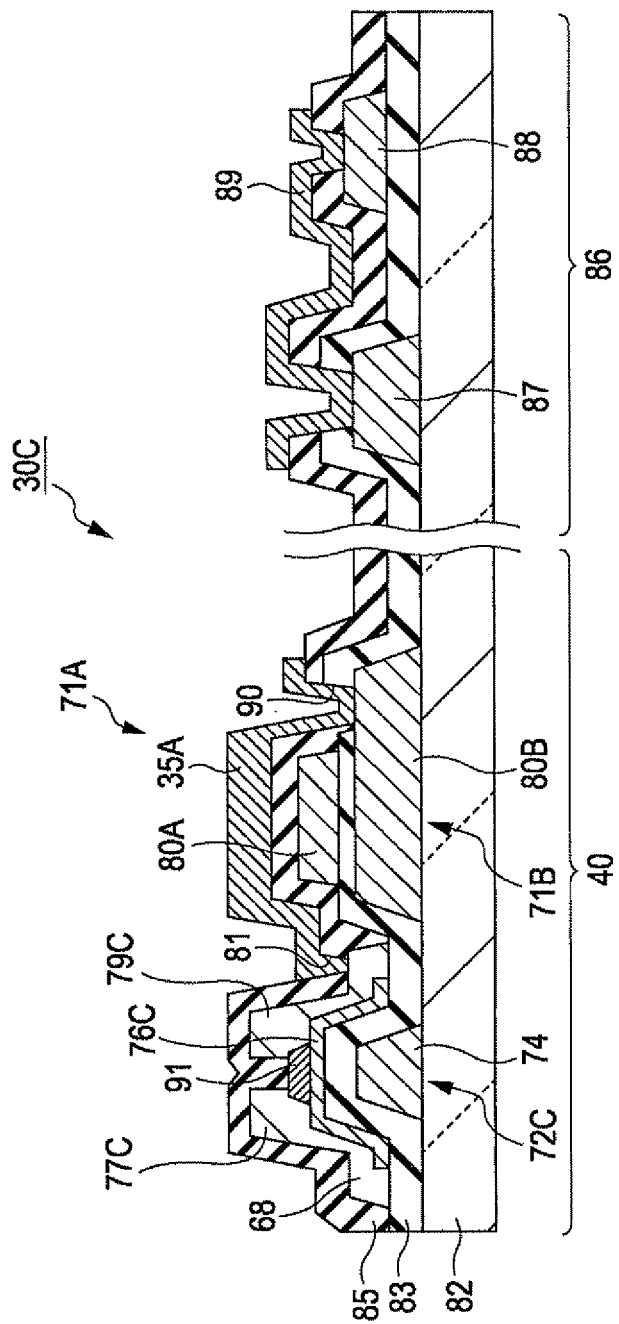
FIG. 12 is a sectional view illustrating each pixel of an element substrate of an electrophoretic display device according to a third embodiment of the invention.

FIG. 12 is a sectional view illustrating an element substrate of the electrophoretic display device according to this embodiment of the invention.

In FIG. 12, the same reference numerals are given to the same constituent elements as those shown in FIG. 11 according to the second embodiment, and the detailed description thereof will not be repeated.

In an element substrate 30C according to this embodiment, as shown in FIG. 12, a semiconductor layer 76C is formed on the gate insulation film 83 and a part of a source electrode 77C and a part of a drain electrode 79C are formed over the top of the semiconductor layer 76C. That is, a TFT 72C according to this embodiment is a top-contact type TFT. In addition, an etching stop layer 91 formed of a silicon nitride film with a film thickness of 200 nm is formed in a region corresponding to the upper side of a channel region of the semiconductor layer 76C. In this embodiment, a transparent oxide semiconductor material such as In—Ga—Zn—O is used in the semiconductor layer 76C. The other configuration is the same as that of the second embodiment.

In order to manufacture the element substrate 30C, the gate electrode 74, the scanning line 66, and the second storage capacitor electrode 80₃ are formed on one surface of the substrate body 82, and then three layers, that is, a silicon nitride film (the first insulation film) with a film thickness of 400 nm which becomes the gate insulation film 83, an In—Ga—Zn—O film which becomes the semiconductor layer 76C, and a silicon nitride film with a film thickness of 200 nm which becomes the etching stop layer 91, are formed. As for the In—Ga—Zn—O film, an amorphous In—Ga—Zn—O film with a composition ratio of In:Ga:Zn=1:1:1 is formed by a sputtering method of using an InGaZnO₄ target.

Next, the silicon nitride film is patterned by a photolithographic method or a wet etching method by using an etchant containing hydrofluoric acid to form the etching stop layer 91. Here, the silicon nitride film is used as the material of the etching stop layer 91. Instead, a silicon oxide film may be used or a laminate film formed by laminating a silicon oxide film and a silicon nitride film may be used.

Next, the In—Ga—Zn—O film is patterned by a photolithographic method and an etching method to form the semiconductor layer 76C.

Next, a conductive film such as Mo/Al/Mo is formed, and then the conductive film is patterned by a photolithographic method or an etching method to form the source electrode 77C, the drain electrode 79C, the first storage capacitor electrode 80A, the capacitor line 67, and the like.

The subsequent processes are the same as those of the first embodiment. The protective film 85 is formed, the contract holes 81 and 90 are formed by a photolithographic method or an etching method, and then the pixel electrode 35 is formed.

The element substrate 30C according to this embodiment is completed by the above-described processes.

In this embodiment, the same advantage as that of the first and second embodiments can be obtained in that it is possible to realize the electrophoretic display device in which the variation in the feed-through voltage is suppressed and the display unevenness is small, by forming the sufficient storage capacitors.

Moreover, the etching stop layer 91 is formed so as to cover the upper side of the channel region of the semiconductor layer 76C. Therefore, the channel region of the semiconductor layer 76C is protected against the etching damage by the etching stop layer 91 when the source electrode 77C and the like are formed. Accordingly, it is possible to form the TFT with small leakage current and the excellent electric characteristic.

In the first and second embodiments, the TFT and the pixel electrode do not overlap with each other in a plan view in order to avoid adverse influence (for example, an increase in the leakage current) on the TFT due to the pixel potential. In this case, even when the pixel electrode is formed of an opaque material, the TFT may not be shielded from light by the pixel electrode. In this embodiment, however, since the transparent oxide semiconductor material such as In—Ga—Zn—O is used as the semiconductor material of the TFT, the leakage current of the TFT caused due to outside light can be considerably reduced compared to the case where the non-monocrystalline silicon material is used in the first and second embodiments. In particular, the configuration with no light-shielding unit such as a black matrix in the counter substrate is suitably applied to the element substrate for the electrophoretic display device since the leakage current caused due to the outside light can be suppressed.

Fourth Embodiment

Hereinafter, a fourth embodiment of the invention will be described with reference to FIG. 13.

An electro-optical device according to this embodiment is also an example of the active matrix type electrophoretic display device, as in the first to third embodiments.

The basic configuration of the electrophoretic display device of this embodiment is the same as that of the second and third embodiments. The storage capacitor of each pixel includes two laminated storage capacitors.

Figure 13:
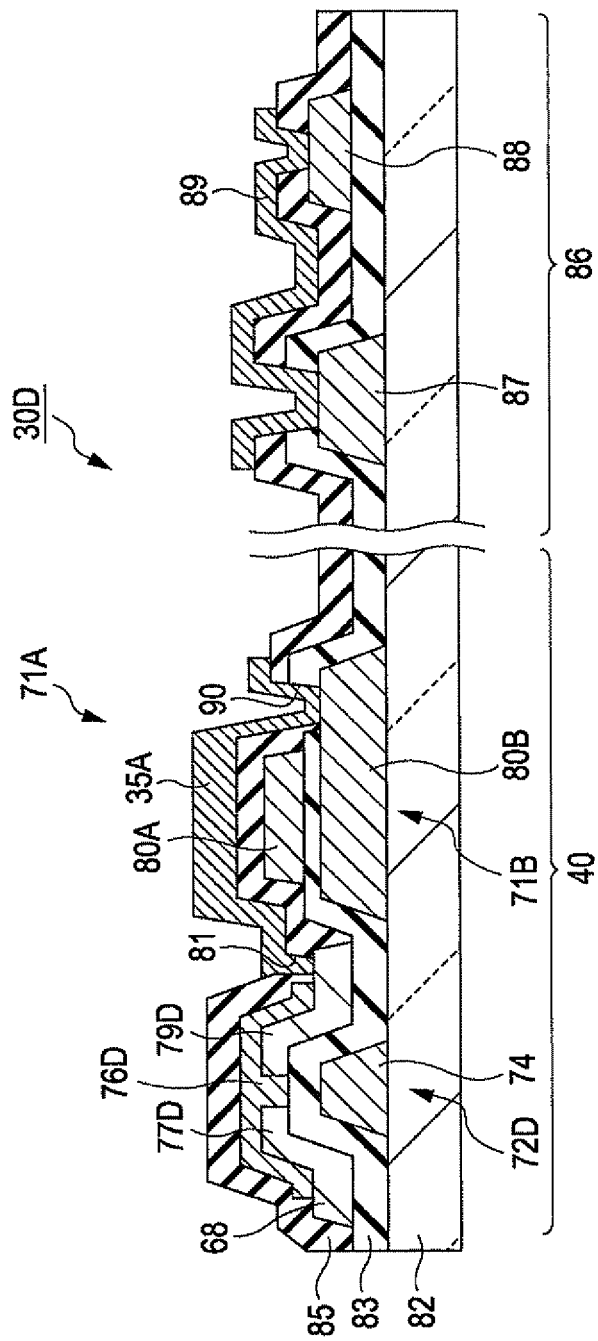
FIG. 13 is a sectional view illustrating each pixel of an element substrate of an electrophoretic display device according to a fourth embodiment of the invention.

FIG. 13 is a sectional view illustrating an element substrate of an electrophoretic display device according to a fourth embodiment of the invention.

In FIG. 13, the same reference numerals are given to the same constituent elements as those shown in FIG. 11 according to the second embodiment, and the detailed description thereof will not be repeated.

In an element substrate 30D according to this embodiment, as shown in FIG. 13, a source electrode 77D and a drain electrode 79D are formed on the gate insulation film 83 and a part of a semiconductor layer 76D is formed over the top of the source electrode 77D and the drain electrode 79D. That is, a TFT according to this embodiment is a bottom-contact type TFT which is different from the TFT of the first to third embodiments. In this embodiment, a transparent oxide semiconductor material such as In—Ga—Zn—O is also used in the semiconductor layer, as in the third embodiment. The other configuration is the same as that of the second and third embodiments.

In order to manufacture the element substrate 30D, the gate electrode 74, the scanning line 66, and the second storage capacitor electrode 80B are formed on one surface of the substrate body 82, and then a silicon nitride film (the first insulation film) with a film thickness of 400 nm which becomes the gate insulation film 83 is formed.

Next, a conductive film such as Mo/Al/Mo is formed, and then the conductive film is patterned by a photolithographic method or an etching method to form the source electrode 77D, the drain electrode 79D, the first storage capacitor electrode 80A, the capacitor line 67, and the like.

Next, the In—Ga—Zn—O film which becomes the semiconductor layer 76D is formed. As for the In—Ga—Zn—O film, an amorphous In—Ga—Zn—O film with a composition ratio of In:Ga:Zn=1:1:1 is formed by a sputtering method of using an InGaZnO₄ target.

Next, the In—Ga—Zn—O film is patterned by a photolithographic method or a wet etching method to form the semiconductor layer 76D.

The subsequent processes are the same as those of the first to third embodiments. The protective film 85 is formed, the contract holes are formed by a photolithographic method or an etching method, and then the pixel electrode 35 is formed.

The element substrate 30D according to this embodiment is completed by the above-described processes.

In this embodiment, the same advantage as that of the first and second embodiments can be obtained in that it is possible to realize the electrophoretic display device in which the variation in the feed-through voltage is suppressed and the display unevenness is small, by forming the sufficient storage capacitors.

Since the source electrode 77D and the drain electrode 79D are formed before the formation of the semiconductor 76D in the manufacturing process according to this embodiment, the semiconductor layer 76D is not damaged due to the etching. Therefore, as in the third embodiment, it is possible to form the TFT excellent in the electric characteristic by the simple manufacturing process without forming the etching stop layer.

As in the third embodiment, it is possible to obtain the advantage of considerably suppressing the leakage current of the TFT caused due to the outside light by using the transparent oxide semiconductor TFT such as In—Ga—Zn—O.

The scope of the invention is not limited to the above-described embodiments, but may be modified in various forms within the scope of the invention without departing from the gist of the invention.

For example, in the first and second embodiments, as shown in FIGS. 5 and 10, the pattern example has been described in which the pixel electrode does not overlap with the first TFT and the second TFT in consideration of the adverse influence on the TFTs caused due to the pixel potential. However, the pixel electrode may overlap on the first TFT and the second TFT as long as there is particularly no problem with the influence on the TFTs.

In this embodiment, the amorphous silicon TFT and the transparent oxide semiconductor TFT are used as the examples. However, an organic TFT, a multi-crystalline silicon TFT, or the like may be used. Since the oxide semiconductor TFT has a higher mobility and has a smaller size than the amorphous silicon TFT, it is possible to reduce the parasitic capacitance between the gate and drain. Accordingly, it is possible to reduce the variation in the feed-through voltage.

The specific configurations of the material, the film thickness, the shape, the manufacturing process of each member of the electrophoretic display device are not limited to the above-described embodiments, but may be appropriately modified.

In the above-described embodiments, the active matrix type electrophoretic display device is used as an example of the electro-optical device. However, the invention is applicable to other electro-optical devices such as an active matrix type liquid crystal display device. For example, when the invention is applied to a reflection liquid crystal display device, the storage capacitance is large. Therefore, even when a writing frequency is set to be low, a holding ratio of the pixel potential can be high. Accordingly, it is possible to obtain the advantage of reducing the power consumption while suppressing flicker.

The invention is more effective when the technique is combined with another technique for increasing a capacitor density. For example, only the region where the storage capacitor is formed may be made thin among the gate insulation film. With such a configuration, the pressure resistance of the TFT is ensured, and thus it is possible to reduce the power consumption while suppressing the leakage current. Specifically, an example of the method of making the gate insulation film thin includes a method of forming two-layered gate insulation films, forming a first gate insulation film on the entire surface, removing the first gate insulation film of the storage capacitor formed region, and then forming a second gate insulation film on the entire surface. According to this method, it is possible to further reduce a variation in the film thickness than a method of etching the first gate insulation film halfway and making the first gate insulation film thin, since the variation in the film thickness of the entire gate insulation film in the storage capacitor formed region is only the variation in the formation of the second gate insulation film.

Electronic Apparatuses

Next, a case where the electrophoretic display device 100 according to the above-described embodiments is applied to an electronic apparatus will be described.

Figure 14:
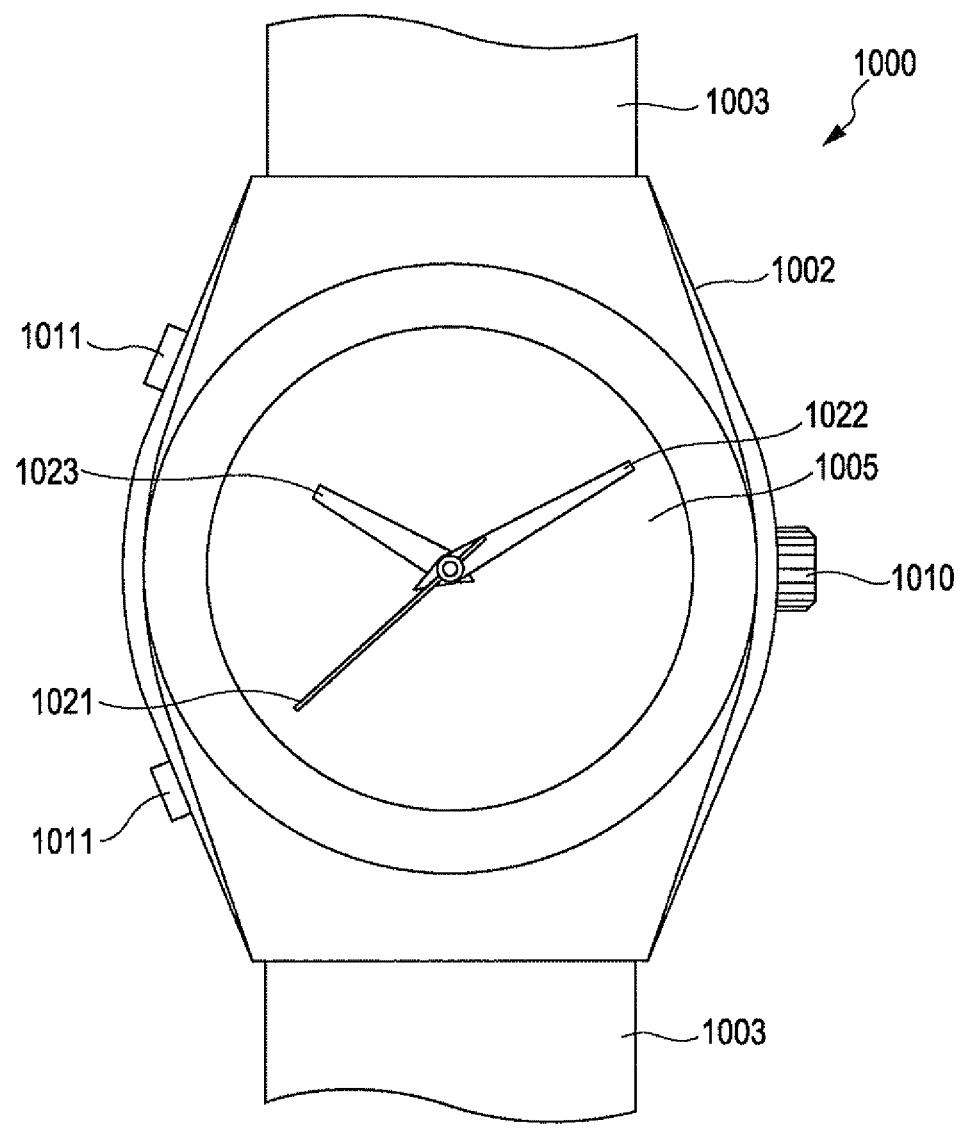
FIG. 14 is a diagram illustrating an electronic apparatus according to an embodiment of the invention.

FIG. 14 is a front view illustrating a wrist watch 1000. The wrist watch 1000 includes a watch case 1002 and a pair of bands 1003 connected to the watch case 1002.

A display unit 1005 for formed of the electrophoretic display device according to the above-described embodiments, a second hand 1021, a minute hand 1022, and an hour hand 1023 are installed on the front of the watch case 1002. A winder 1010 serving as an operator and operational buttons 1011 are installed on the side of the watch case 1002. The winder 1010 is connected to a winding brass (not shown) installed inside the case so as to be integrated with the winding brass and is installed so as to be pressed at multi steps (for example, two steps) and so as to be rotatable. A background image, a character line such as a date or a time, a second hand, a minute hand, an hour hand, and the like can be displayed on the display unit 1005.

Figure 15:
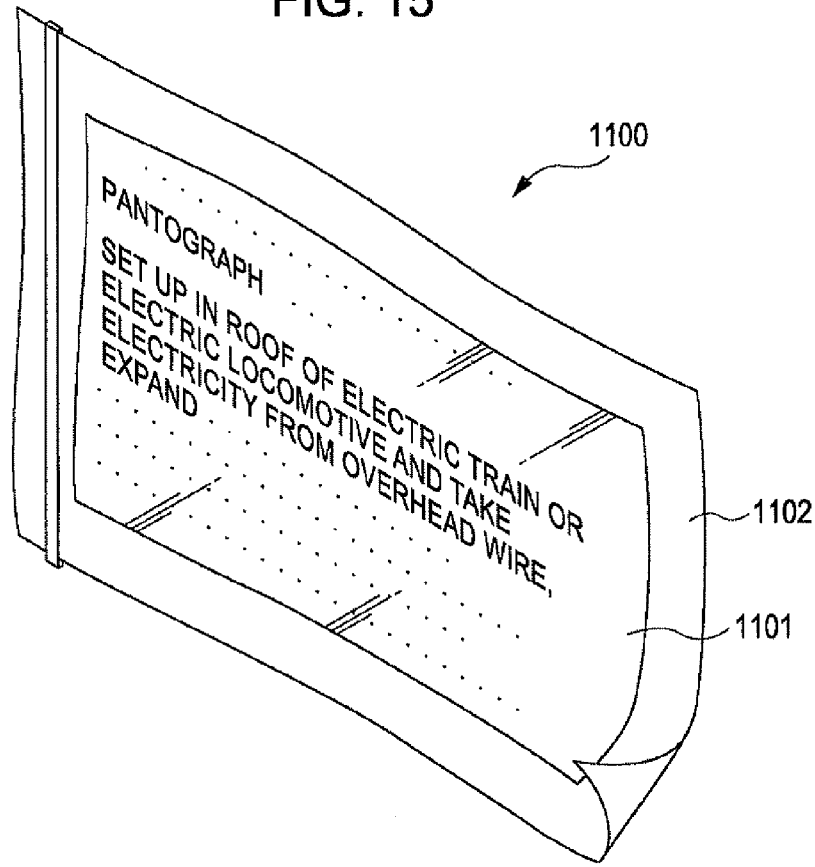
FIG. 15 is a diagram illustrating an electronic apparatus according to another embodiment of the invention.

FIG. 15 is a perspective view illustrating the configuration of an electronic paper 1100. The electronic paper 1100 includes the electrophoretic display device according to the above-described embodiments in a display area 1101. The electronic paper 1100 is flexible and includes a main body 1102 formed of a rewritable sheet having texture and flexibility like similar to general paper.

Figure 16:
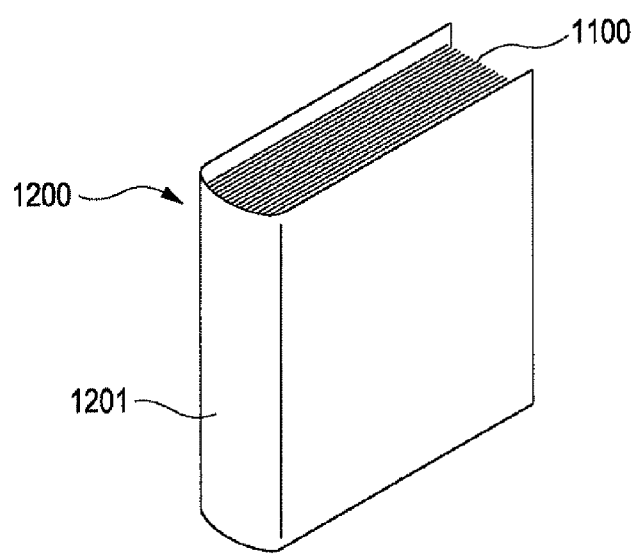
FIG. 16 is a diagram illustrating an electronic apparatus according to still another embodiment of the invention.

FIG. 16 is a perspective view illustrating the configuration of an electronic note 1200. The electronic note 1200 is made by binding plural sheets of electronic paper 1100 and attaching a cover 1201. The cover 1201 includes a display data inputting unit (not shown) which inputs, for example, display data transmitted from an external apparatus. Therefore, display details can be changed or updated in accordance with the display data with the electronic paper bound.

Since the electrophoretic display device according to the invention is used in the wrist watch 1000, the electronic paper 1100, and the electronic note 1200, the electronic apparatuses including the display device capable of maintaining a display quality for a long time and being excellent in reliability can be realized.

The electronic apparatuses are just examples according to the invention and do not limit the technical scope of the invention. For example, the electrophoretic display device according to the invention is also applicable to a display device of an electronic apparatus such as a portable telephone or a portable audio apparatus.

What is claimed is:

1. An electro-optical device substrate comprising:
    a substrate body;
    a plurality of data lines and a plurality of scanning lines formed in the substrate body; and
    a plurality of pixels partitioned by the data lines and the scanning lines,
    wherein each of the plurality of pixels includes a pixel switching element, a pixel electrode, and a first storage capacitor,
    wherein the pixel switching element includes
        a gate electrode formed of a first conductive film formed on the substrate body,
        a gate insulation film formed of a first insulation film formed so as to cover at least the gate electrode,
        a semiconductor layer formed on the gate insulation film,
        a source electrode formed of a second conductive film electrically connected to a source region of the semiconductor layer and the data line, and a drain electrode formed of the second conductive film electrically connected to a drain region of the semiconductor layer and the pixel electrode, and wherein the first storage capacitor includes
a first storage capacitor electrode formed of the second conductive film,
a first storage insulation film formed of a second insulation film so as to cover at least the first storage capacitor electrode, and
the pixel electrode formed so as to overlap with the first storage capacitor electrode at least partially with the first storage insulation film interposed therebetween when viewed from a normal direction of the substrate body.

2. The electro-optical device substrate according to claim 1,
wherein each of the plurality of pixels includes a second storage capacitor formed so as to overlap with the first storage capacitor at least partially when viewed from the normal direction of the substrate body, and
wherein the second storage capacitor includes
a second storage capacitor electrode formed of the first conductive film,
a second storage insulation film formed of the first insulation film so as to cover at least the second storage capacitor electrode, and
the first storage capacitor electrode formed so as to overlap with the second storage capacitor electrode at least partially with the second storage insulation film interposed therebetween when viewed from the normal direction of the substrate body.

3. An electro-optical device comprising:
a pair of substrates; and
an electro-optical material layer interposed between the pair of substrates,
wherein one of the pair of substrates is the electro-optical device substrate according to claim 2.

4. The electro-optical device substrate according to claim 1, wherein a film thickness of the second insulation film is thinner than a film thickness of the first insulation film.

5. An electro-optical device comprising:
a pair of substrates; and
an electro-optical material layer interposed between the pair of substrates,
wherein one of the pair of substrates is the electro-optical device substrate according to claim 4.

6. The electro-optical device substrate according to claim 1, wherein a part of the source electrode and a part of the drain electrode are formed over the top of the semiconductor layer, the source electrode is electrically connected to the source region of the semiconductor layer, and the drain electrode is electrically connected to the drain region of the semiconductor layer.

7. The electro-optical device substrate according to claim 6, wherein an etching stop layer is disposed in a region corresponding to an upper side of a channel region of the semiconductor layer.

8. An electro-optical device comprising:
a pair of substrates; and
an electro-optical material layer interposed between the pair of substrates,
wherein one of the pair of substrates is the electro-optical device substrate according to claim 7.

9. An electro-optical device comprising:
a pair of substrates; and
an electro-optical material layer interposed between the pair of substrates,
wherein one of the pair of substrates is the electro-optical device substrate according to claim 6.

10. The electro-optical device substrate according to claim 1, wherein a part of the semiconductor layer is formed over the top of the source electrode and the drain electrode, the source electrode is electrically connected to the source region of the semiconductor layer, and the drain electrode is electrically connected to the drain region of the semiconductor layer.

11. An electro-optical device comprising:
a pair of substrates; and
an electro-optical material layer interposed between the pair of substrates,
wherein one of the pair of substrates is the electro-optical device substrate according to claim 10.

12. The electro-optical device substrate according to claim 1, wherein the semiconductor layer is formed of non-monocrystalline silicon.

13. An electro-optical device comprising:
a pair of substrates; and
an electro-optical material layer interposed between the pair of substrates,
wherein one of the pair of substrates is the electro-optical device substrate according to claim 12.

14. The electro-optical device substrate according to claim 1, wherein the semiconductor layer is formed of an oxide semiconductor material.

15. An electro-optical device comprising:
a pair of substrates; and
an electro-optical material layer interposed between the pair of substrates,
wherein one of the pair of substrates is the electro-optical device substrate according to claim 14.

16. The electro-optical device substrate according to claim 1, wherein the semiconductor layer is formed of a transparent oxide semiconductor material.

17. An electro-optical device comprising:
a pair of substrates; and
an electro-optical material layer interposed between the pair of substrates,
wherein one of the pair of substrates is the electro-optical device substrate according to claim 16.

18. The electro-optical device substrate according to claim 1, wherein the semiconductor layer is formed of an organic semiconductor material.

19. An electro-optical device comprising:
a pair of substrates; and
an electro-optical material layer interposed between the pair of substrates,
wherein one of the pair of substrates is the electro-optical device substrate according to claim 1.

20. An electronic apparatus comprising the electro-optical device according to claim 19.

* * * * *